(12) United States Patent
Kimura et al.

(10) Patent No.: US 8,331,415 B2
(45) Date of Patent: Dec. 11, 2012

(54) LASER LIGHT SOURCE DEVICE AND LASER IRRADIATION APPARATUS USING THE SAME

(75) Inventors: Kaoru Kimura, Tokyo (JP); Michio Oka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/490,083

(22) Filed: Jun. 23, 2009

(65) Prior Publication Data

US 2010/0002731 A1    Jan. 7, 2010

(30) Foreign Application Priority Data

Jul. 1, 2008    (JP) .................. 2008-172667

(51) Int. Cl.
*H01S 3/091*    (2006.01)
(52) U.S. Cl. .......... 372/71; 372/75; 372/41; 372/10; 372/22; 372/21
(58) Field of Classification Search .......... 372/71, 372/75, 41, 10, 22, 21
See application file for complete search history.

(56) References Cited

U.S. PATENT DOCUMENTS

| | | | | |
|---|---|---|---|---|
| 5,157,754 A | * | 10/1992 | Bierlein et al. | 385/122 |
| 5,473,409 A | * | 12/1995 | Takeda et al. | 355/53 |
| 2003/0156303 A1 | * | 8/2003 | Schnee et al. | 358/509 |
| 2006/0018355 A1 | * | 1/2006 | Feitisch et al. | 372/50.12 |

FOREIGN PATENT DOCUMENTS

| | | |
|---|---|---|
| JP | 50-148096 | 11/1975 |
| JP | 11-326971 | 11/1999 |
| JP | 2003-347237 | 12/2003 |
| JP | 2006-066818 | 3/2006 |
| JP | 2006066818 A * | 3/2006 |
| JP | 2006-140919 | 6/2006 |
| JP | 2008-112846 | 5/2008 |

OTHER PUBLICATIONS

Applied Physics vol. 76, No. 6, 619 (2007).
Okamoto et al., "High Power Green Laser and Annealing Optical System for the Low Temperature Polycrystalline Silicon Process for Liquid Crystal Displays and Organic Light Emitting Diode Displays", The Review of Laser Engineering, 34, 10, 693 (2006).

* cited by examiner

*Primary Examiner* — Kinam Park
(74) *Attorney, Agent, or Firm* — Robert J. Depke; Rockey, Depke & Lyons, LLC

(57) ABSTRACT

A laser light source device includes a pump light source which emits transverse-multimode light; a plurality of resonator mirrors which define a resonator, at least part of the resonator mirrors outputting light to the outside, where the output light having plural wavelengths; a laser medium arranged in the resonator, the laser medium being pumped with the transverse-multimode light emitted from the pump light source; and a wavelength conversion element arranged in the resonator, the wavelength conversion element being irradiated with a transverse-multimode line beam of fundamental wave obtained by oscillation at the laser medium and outputting a line beam of converted wave.

10 Claims, 13 Drawing Sheets

FIG. 2A
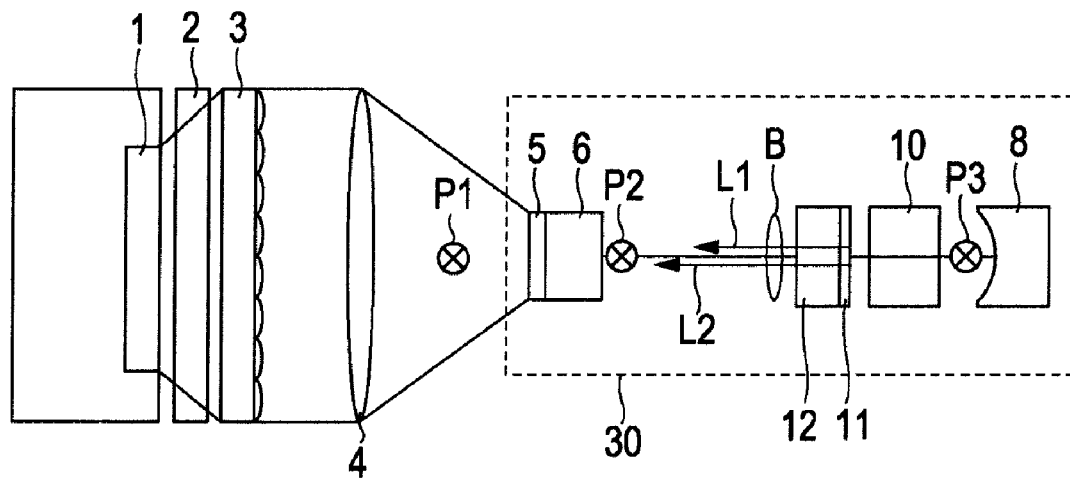
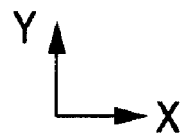
FIG. 2B
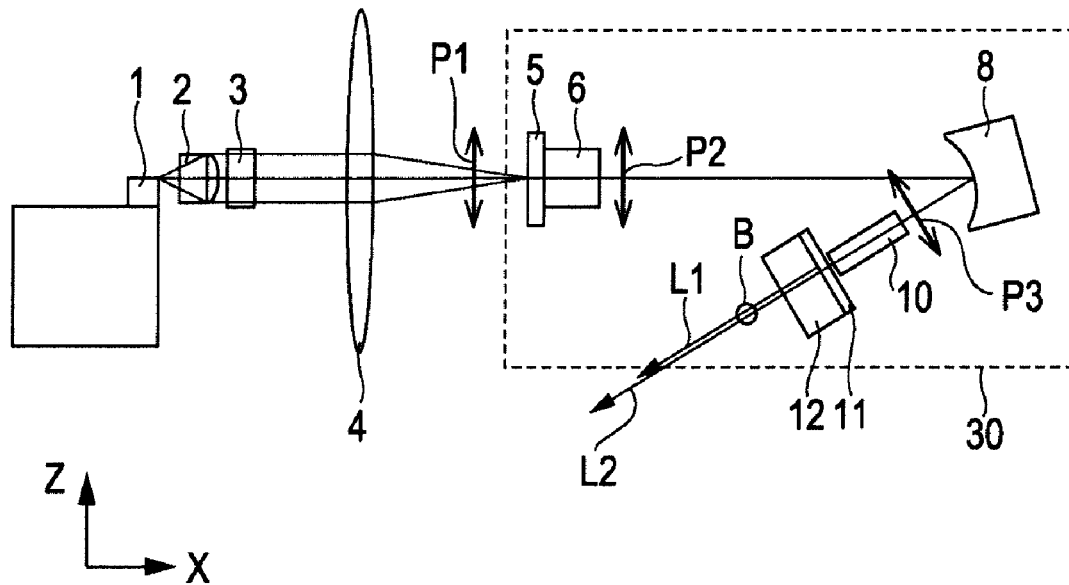
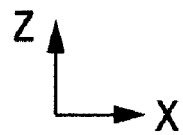

TIME AT POSITION P

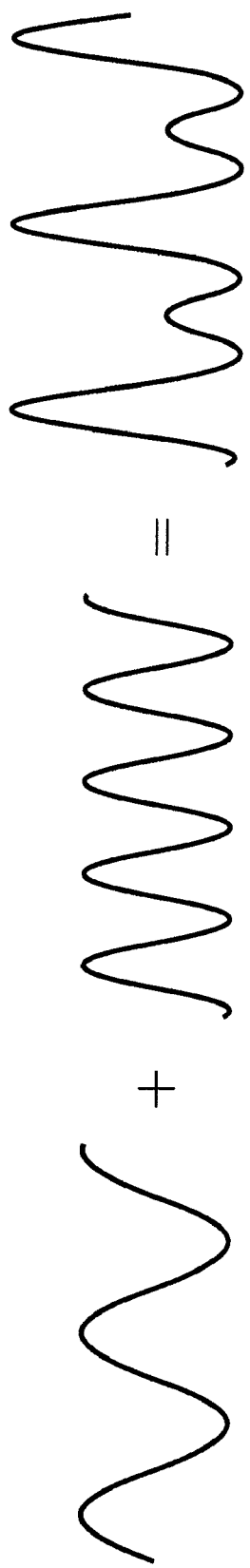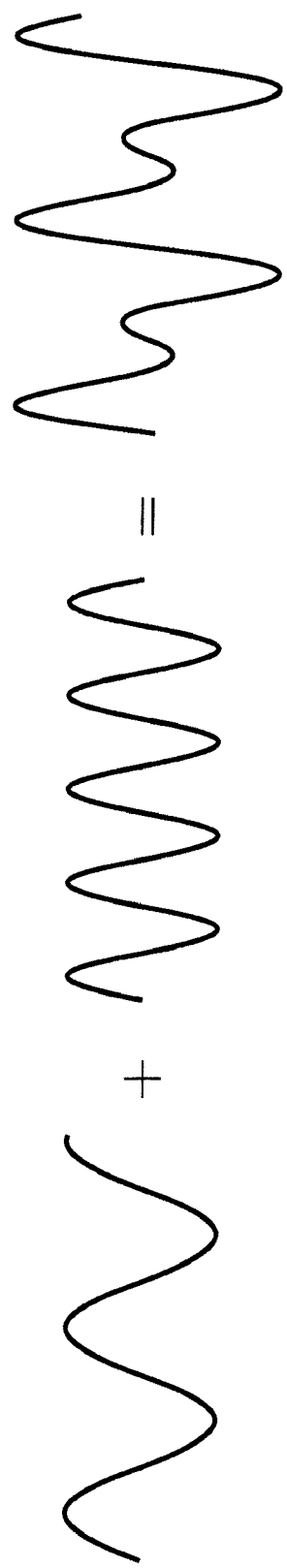

FIG. 8A
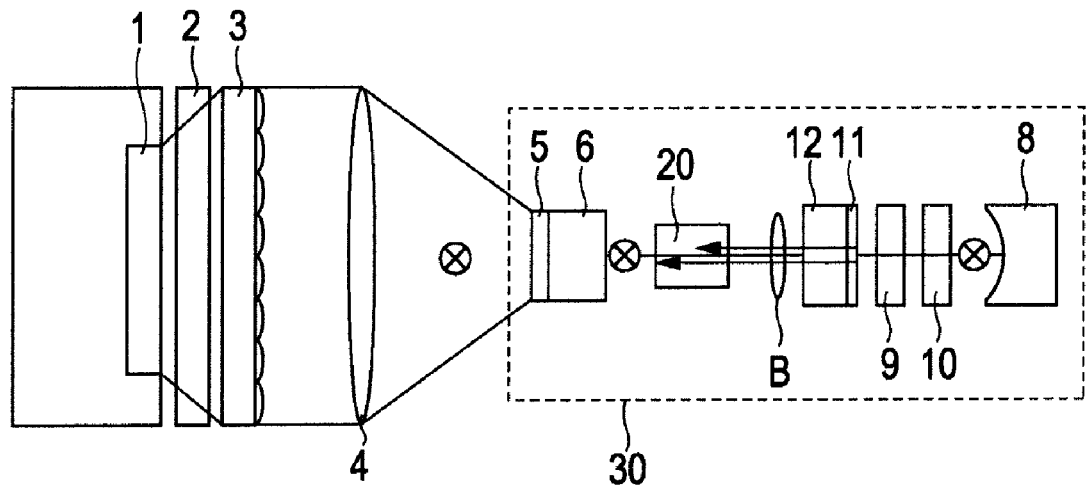
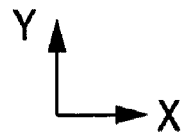
FIG. 8B
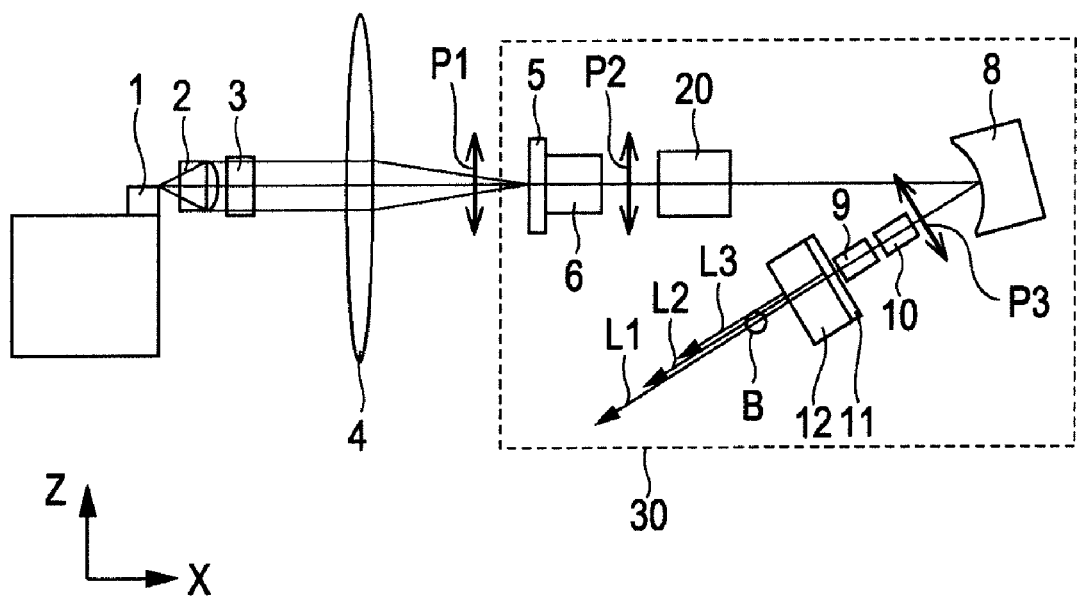
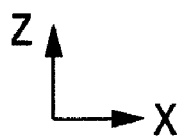

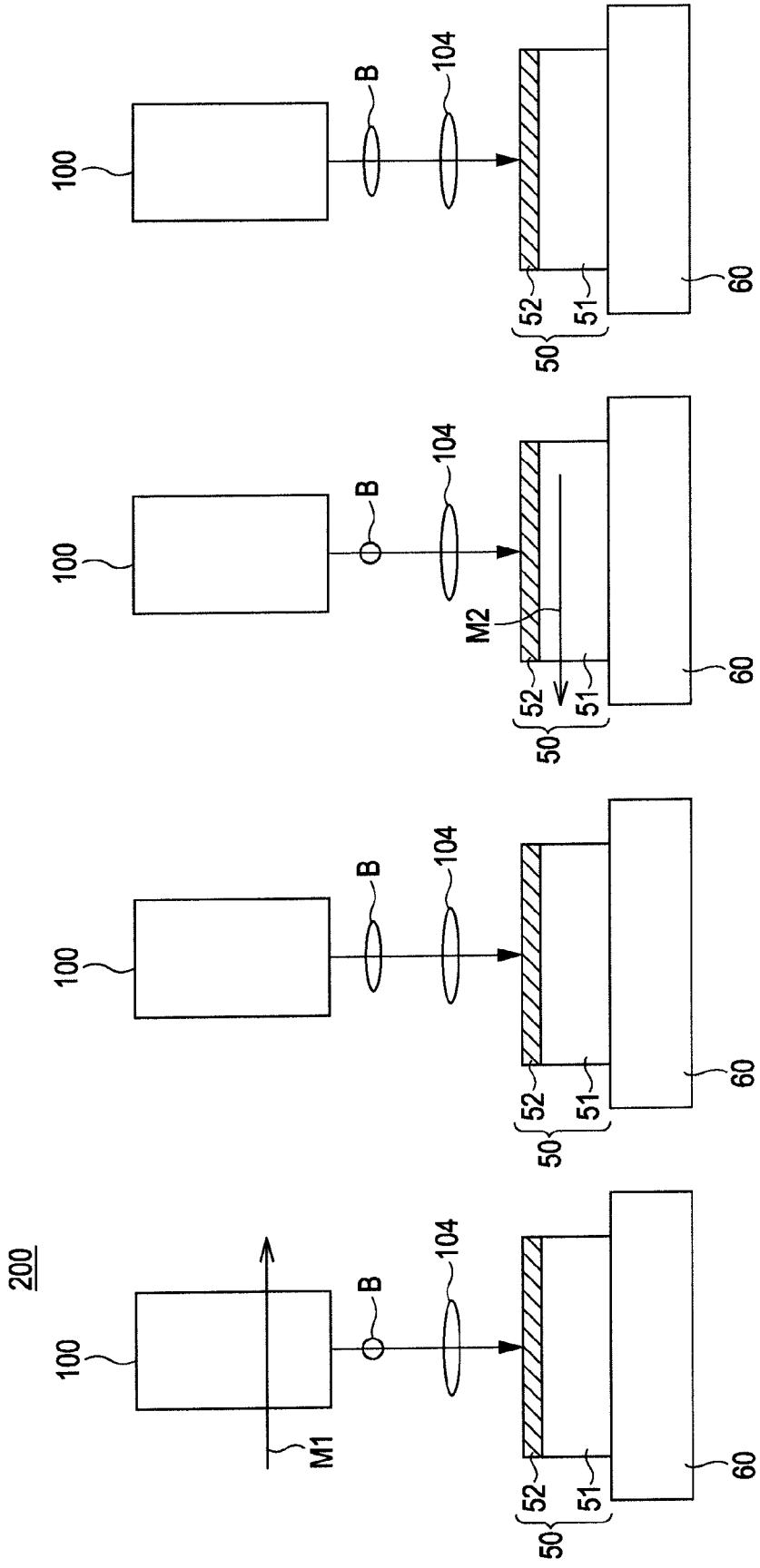

LASER LIGHT SOURCE DEVICE AND LASER IRRADIATION APPARATUS USING THE SAME

The present application claims priority to Japanese Patent Application JP 2008-172667, filed in the Japan Patent Office on Jul. 1, 2008, the entire contents of which are hereby incorporated by reference.

BACKGROUND OF THE INVENTION

1. Field of the Invention

The present invention relates to a laser light source device that outputs transverse-multimode light, and a laser irradiation apparatus using the laser light source device.

2. Description of the Related Art

In recent years, a laser annealing technique has become popular, in which an amorphous silicon thin film is irradiated with laser light to change the amorphous silicon thin film into a polycrystalline silicon thin film. This process is a modification process contained in laser processes such as modifying, processing (punching, cutting, welding, etc.) a substance, or exposing a substance (lithography). The technique is used for a manufacturing process of a thin-film transistor (TFT) which is applied to, for example, a liquid crystal display device or an organic electroluminescence display device. The technique is also used for a manufacturing process of an optical sensor such as a line sensor, a photovoltaic power generation element such as a high-performance thin film solar cell, or a semiconductor device such as a semiconductor integrated circuit, e.g., a memory LSI, using a semiconductor film. In particular, in a case where a thin film made of polycrystalline silicon or microcrystalline silicon is fabricated by a low-temperature process in which laser annealing is applied to a substrate, electron mobility can be increased as compared with the amorphous silicon thin film while the degree of freedom for the low-temperature process and the substrate structure is assured. Thus, high-speed response is achieved.

For a light-absorptive element, such as a solar cell, light utilization efficiency can be maximized by using the polycrystalline silicon or the microcrystalline silicon. For example, a solar cell is configured to have a tandem structure including an amorphous silicon thin film and a microcrystalline silicon thin film. Hence, the solar cell can efficiently absorb the sun light with a short wavelength, thereby increasing efficiency of the entire cell (see "OYO BUTURI", a publication of The Japan Society of Applied Physics, Vol. 76, No. 6, 619, 2007).

In addition, when the laser annealing technique is used, microcrystal or polycrystal grains can be fabricated on an inexpensive, large glass or plastic substrate without the substrate heated at a high temperature. Thus, the cost can be decreased and the performance can be increased.

In the laser annealing apparatus, a gas laser, or an excimer laser of pulse light with 100 W or higher in average has been used. Also, a solid laser of a substantially fundamental Gaussian beam, and a relatively small semiconductor laser have been studied and developed. However, to perform excimer laser annealing (ELA), periodic maintenances, such as frequently exchanging gas, frequently replacing a tube, and cleaning an extraction window, have to be carried out. In addition, variation in pulse output may cause crystal grains after annealing to be small and the grain diameter may likely vary. As a result, the mobility of an obtained polycrystalline film becomes small. This is because a variation of a pulse light intensity is large with respect to an average output variation of the laser light, that is, a process margin is small with respect to the average output variation. Also, a silicon thin film has a large absorption coefficient for ultraviolet, and hence, only a portion of the silicon thin film near the surface absorbs the ultraviolet. The silicon thin film becomes polycrystal and a portion of the silicon thin film near a glass substrate becomes silicon microcrystal as the core (see "The Review of Laser Engineering", a publication of The Laser Society of Japan, Vol. 34, No. 10, 693, 2006).

In contrast, when a solid laser, more particularly, a green laser using second harmonic generation is employed, the periodic maintenances such as those for the gas laser are not necessary. A silicon thin film has different absorption coefficients for different irradiation wavelengths. Thus, the green light with a longer wavelength than that of the ultraviolet reaches a deeper portion of the thin film, thereby heating and melting the entire film of the amorphous silicon. Accordingly, the size of crystal grains becomes large, and the characteristic of the film such as mobility can be improved (see "The Review of Laser Engineering", a publication of The Laser Society of Japan, Vol. 34, No. 10, 693, 2006).

Further, a configuration has been suggested in which the solid laser is used, and in addition to the second harmonic generation, a fundamental wave oscillated by a laser resonator is partly transmitted through the resonator. Accordingly, a deeper portion of the amorphous silicon thin film is heated with the fundamental wave for which the thin film has a small absorption coefficient, and simultaneously, the amorphous silicon thin film is melted at the surface with a second harmonic wave for which the thin film has a large absorption coefficient (see Japanese Unexamined Patent Application Publication No. 2003-347237).

SUMMARY OF THE INVENTION

The method disclosed in Japanese Unexamined Patent Application Publication No. 2003-347237 uses the solid laser. The substantially fundamental Gaussian beam provided by the solid laser has to be converted into a line beam, which is suitable for a process such as annealing. However, a $M^2$ value of the laser beam is small and coherency is high. Thus, if a homogenizer equalizes the beam, spatial intensity modulation likely occurs due to interference fringes. Also, the spatial intensity modulation may vary with time, likely resulting in a noise of the output. Thus, the solid laser of the fundamental Gaussian beam has to use an optical system which hardly generates interference fringes because the solid laser has a high coherency. Therefore, the optical path may become long, and the degree of freedom for design may be limited (see "The Review of Laser Engineering", a publication of The Laser Society of Japan, Vol. 34, No. 10, 693, 2006).

Also, when the fundamental wave and the second harmonic wave are extracted from the laser resonator, a phase relationship may appear between the fundamental wave and the second harmonic wave because the laser light has a high coherency. Hence, spatial and temporal intensity modulation noises are likely generated. Further, when the fundamental wave and the second harmonic wave are used, since wavelength conversion efficiency is proportional to a power density of the fundamental wave, and the output of wavelength conversion is nonlinear with respect to the fundamental wave output, the conversion efficiency increases toward a center portion of the beam of the fundamental wave, and hence the beam diameter after the wavelength conversion becomes smaller than the beam diameter of the fundamental wave. The Gaussian beam features that the beam diameter of the beam to be condensed becomes smaller as the wavelength thereof decreases. As a result, when the Gaussian beam is simply converted into the line beam, the second harmonic wave may become smaller in the longitudinal direction. When a silicon thin film is irradiated with the second harmonic wave, a complicated optical design is necessary for keeping the process uniformity in the longitudinal direction. Furthermore, when laser annealing is applied to a large substrate, as long as the output is high, the throughput increases and the cost decreases. However, since a second-harmonic-wave solid laser even with output of several watts has a large size, it is difficult to arrange the light source at a position above a substrate for laser annealing, and it is difficult to arrange a plurality of light sources in parallel to each other.

In light of the situation, it is desirable to provide a compact, high-efficient laser light source device providing stable and uniform beam profile and beam intensity, and to provide a laser irradiation apparatus using the laser light source device.

According to an embodiment of the invention, a laser light source device includes a pump light source which emits transverse-multimode light; a plurality of resonator mirrors which define a resonator, at least part of the resonator mirrors outputting light to the outside, where the output light having plural wavelengths; a laser medium arranged in the resonator, the laser medium being pumped with the transverse-multimode light emitted from the pump light source; and a wavelength conversion element arranged in the resonator, the wavelength conversion element being irradiated with a transverse-multimode line beam of fundamental wave obtained by oscillation at the laser medium and outputting a line beam of converted wave.

Also, according to another embodiment of the invention, a laser irradiation apparatus includes a laser light source device including a pump light source which emits transverse-multimode light, a plurality of resonator mirrors which define a resonator, at least part of the resonator mirrors outputting light to the outside of the resonator, where the output light having plural wavelengths, a laser medium arranged in the resonator, the laser medium being pumped with the transverse-multimode light emitted from the pump light source, and a wavelength conversion element arranged in the resonator, the wavelength conversion element being irradiated with a transverse-multimode line beam of fundamental wave obtained by oscillation at the laser medium and outputting a line beam of converted wave; and a stage on which a substance to be irradiated with laser light output to the outside of the resonator is mounted.

As described above, with the laser light source device and the laser irradiation apparatus, the laser medium is pumped with the transverse-multimode light, and the wavelength conversion element is irradiated with the transverse-multimode line beam of fundamental wave obtained by oscillation at the laser medium. Then, the line beam of converted wave obtained by the conversion with the wavelength conversion element is output. In particular, lights with different wavelengths, for example, lights with different wavelengths of the fundamental wave and the converted wave, or the second harmonic wave or the third harmonic wave are transmitted through one of the resonator mirrors or the reflecting portion for bending in the resonator, and are output to the outside.

With this configuration, the obtained output light is the transverse-multimode light which is obtained by pumping the laser medium with the transverse-multimode light. The transverse-multimode light has a very low coherency and the spatial intensity modulation hardly occurs due to interference fringes. Also, since the overlap in the transverse multimode is small, the nonlinear coupling through sum frequency generation between modes is significantly small. Hence, it can prevent or reduce that the spatial intensity modulation varies with time and results in a noise of the output. Further, the transverse multimode provides stability and uniformity because of the low coherency. Thus, an additional optical component is not necessary to achieve stability and uniformity. The configuration of the laser light source device can be simple and reduced in size. Further, a complicated optical system for reducing interference fringes is not necessary. Thus, the laser irradiation apparatus can be reduced in size.

With the embodiments of the invention, the compact, high-efficient laser light source device providing stable and uniform beam profile and beam intensity, and the laser irradiation apparatus using the laser light source device cab be achieved.

BRIEF DESCRIPTION OF THE DRAWINGS

FIGS. 2A and 2B are configuration diagrams briefly showing a laser light source device according to an embodiment of the invention;

FIGS. 4A and 4B illustrate amplitude changes of wavelengths when high-coherent light sources are used and lights with different wavelengths are combined;

FIGS. 8A and 8B are configuration diagrams briefly showing a laser light source device according to an embodiment of the invention;

FIGS. 12A to 12D are configuration diagrams briefly showing a laser irradiation apparatus according to an embodiment of the invention;

DESCRIPTION OF THE PREFERRED EMBODIMENTS

Preferred embodiments for implementing the invention will be described below. However, the invention is not limited to the embodiments.

[1] First Embodiment

Figure 1A:
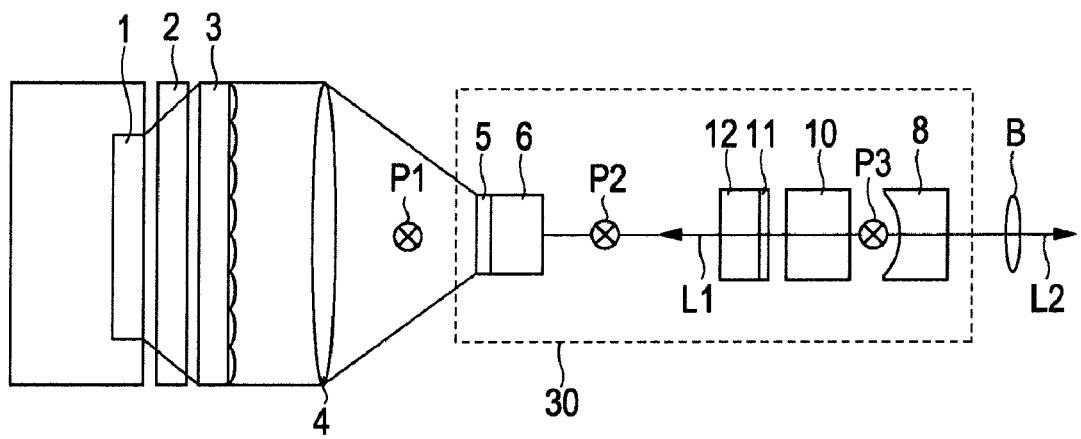
FIGS. 1A and 1B are configuration diagrams briefly showing a laser light source device according to an embodiment of the invention.
Figure 1B:
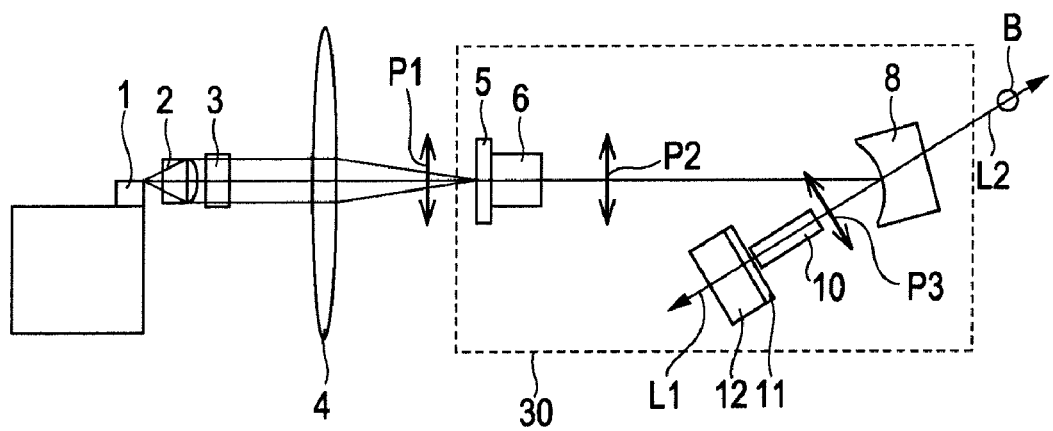

FIGS. 1A, 1B, 2A, and 2B illustrate brief configurations of laser light source devices according to a first embodiment of the invention. The laser light source device of this embodiment uses linear transverse-multimode light. The longitudinal direction of the light represents the Y direction, the short-axis direction thereof represents the Z direction, and a light-advancing direction represents the X direction. FIGS. 1A and 2A are configuration diagrams taken along the X-Y plane, and FIGS. 1B and 2B are configuration diagrams taken along the X-Z plane.

Referring to FIGS. 1A, 1B, 2A, and 2B, a laser light source device 100 includes a pump light source 1, such as a laser diode array, which outputs transverse-multimode pump light. Collimator optical systems 2 and 3, and a condenser lens 4 are arranged on an emission optical path of the pump light source 1. A reflecting film 5 serving as a resonator mirror, a laser medium 6, and a reflecting portion 8 for bending a resonance optical path are arranged. A wavelength conversion element 10 and a resonator mirror 12 having a wavelength selective film 11 are arranged on a reflection optical path of the reflecting portion 8 for bending. An optical path formed by the resonator mirror 5, the reflecting portion 8, and the resonator mirror 12 defines a resonator 30.

The transverse-multimode light emitted from the pump light source 1 such as a laser diode is shaped into a proper beam profile by the collimator optical systems 2 and 3, and the condenser lens 4. Though not shown, the light may be directed to proper polarization directions along wavelength-conversion directions, for example, indicated by arrows P1 to P3 by quarter-wave plates or the like if necessary. The transverse-multimode light pumps the laser medium 6, and a transverse-multimode line beam of fundamental wave is oscillated in the resonator 30 defined by the plurality of resonator mirrors 5 and 12. The wavelength conversion element 10 is irradiated with the fundamental wave, and a line beam of converted wave L2, such as a second harmonic wave, is generated.

In this embodiment, a line beam of fundamental wave represents a fundamental wave having a horizontally long ellipsoidal beam profile. For example, the ellipsoidal beam profile of the light has a ratio of the major and minor axes (aspect ratio) being as relatively high as about 10 or more. In a cross-sectional plane along the longitudinal direction of the transverse-multimode light and the pump-light-advancing direction shown in FIGS. 1A and 2A, a cross-sectional profile of a beam B has a smooth profile of the transverse multimode. In a cross-sectional plane along the short-axis direction of the transverse-multimode light and the pump-light-advancing direction shown in FIGS. 1B and 2B, a cross-sectional profile of the beam B has a substantially circular shape in a substantially Gaussian plane.

Now, example materials etc. applicable to the laser medium 6 and the wavelength conversion element 10 in the laser light source device 100 of this embodiment will be described.

The laser medium 6 uses a solid laser material with rare earth added. For example, Nd:YAG, Nd:YVO$_4$, Nd:GdVO$_4$, Yb:YAG, or Yb:YVO$_4$, in which yttrium aluminum garnet (Y$_3$Al$_5$O$_{12}$) is doped with Nd ion, may be used.

The wavelength conversion element 10 is formed of a nonlinear optical crystal or a nonlinear optical element. For example, the wavelength conversion element 10 is used for wavelength conversion such as second harmonic generation (SHG) or third harmonic generation (THG). Alternatively, the wavelength conversion element 10 is used for sum frequency generation, optical parametric oscillation, etc. The material of the wavelength conversion element 10 may be KTiOPO$_4$, β-BaB$_2$O$_4$ (BBO), LiB$_3$O$_5$ (LBO), LiTaO$_3$, or LiNbO$_3$, or a congruent composition of the listed material, a stoichiometric composition of the listed material, or a material with an additive, such as MgO or ZnO, added.

For example, a crystal material, such as C—LiNbO$_3$, C—LiTaO$_3$, S—LiNbO$_3$, S—LiTaO$_3$, MgO:C—LiNbO$_3$, MgO:C—LiTaO$_3$, ZnO:C—LiNbO$_3$, or ZnO:C—LiTaO$_3$, may be used. Alternatively, a crystal material, such as MgO:S—LiNbO$_3$, MgO:S—LiTaO$_3$, ZnO:S—LiNbO$_3$, or ZnO:S—LiTaO$_3$, may be used.

Still alternatively, a crystal element in which poling processing is applied, such as PP—C—LiNbO$_3$, PP—C—LiTaO$_3$, PP—S—LiNbO$_3$ (PPSLN), PP—S—LiTaO$_3$ (PPSLT), PP—MgO:C—LiNbO$_3$, or PP—MgO:C—LiTaO$_3$, may be used. Further alternatively, a crystal element, such as PP—ZnO:C—LiNbO$_3$, PP—ZnO:C—LiTaO$_3$, PP—MgO:S—LiNbO$_3$, PP—MgO:S—LiTaO$_3$, PP—ZnO:S—LiNbO$_3$, PP—ZnO:S—LiTaO$_3$, or PP—KTiOPO$_4$, may be used. Herein, "C" denotes "congruent composition", "S" denotes "stoichiometric composition", and "PP" denotes "periodical poling".

A nonlinear optical crystal having the periodical poling structure has a larger nonlinear optical constant than that of a nonlinear optical crystal in the past. High conversion efficiency is provided and mass production by a wafer forming process technique is available, resulting in reduction in cost. In particular, when periodically poled stoichiometric lithium tantalate (PPSLT), which is obtained by, for example, vapor transport equilibration (VTE), is used as the nonlinear optical material having the periodical poling structure, photorefractive resistance is improved as compared with the congruent composition. The material provides a device having long-term reliability and high conversion efficiency. High output light (second-harmonic-wave light etc.) with several watts or higher can be stably provided.

When the wavelength conversion element 10 using the above-described nonlinear optical crystal or nonlinear optical element is arranged in the resonator 30, high power density of oscillation light enclosed in the resonator 30 can be used. Accordingly, wavelength conversion with high efficiency can be provided. When the nonlinear optical crystal or nonlinear optical element is arranged outside the resonator 30, pulse oscillation has to be carried out for high-efficient conversion. In contrast, when the nonlinear optical crystal or nonlinear optical element is arranged in the resonator 30, high-efficient conversion is available even with continuous wave oscillation.

In examples shown in FIGS. 1A, 1B, 2A, and 2B, the reflecting portion 8, which is, for example, a concave mirror for bending the optical path, is arranged between the resonator mirrors 5 and 12 defining the resonator 30. Since the structure for bending the resonance optical path is employed, the laser light source device 100 can be reduced in size. Also, the longitudinal direction of the transverse-multimode line beam of fundamental wave is arranged to be substantially perpendicular to an incidence surface of the reflecting portion 8 provided in the resonator 30, that is, a plane defined by a bending optical path including an incident light beam and a reflected light beam.

In a laser light source device using a line beam of fundamental wave of, for example, transverse multimode, in the case where the reflecting portion 8 is arranged in the resonator 30 for the reduction in size, arranging the longitudinal direction of the fundamental wave to be along the incidence surface of the reflecting portion 8 may degrade spatial symmetric property with respect to the longitudinal direction of the line beam. Owing to this, it is difficult to improve uniformity and stability of the output light.

In contrast, arranging the longitudinal direction of the fundamental wave to be substantially perpendicular to the plane of the bending optical path by the reflecting portion 8 can keep the spatial symmetric property with respect to the longitudinal direction of the fundamental wave. Hence, the converted wave converted by the wavelength conversion element 10 can be spatially symmetric with respect to the longitudinal direction. The output light can be prevented from being asymmetric and non-uniform, resulting in symmetrization and uniformalization of the output light.

In the laser light source device 100 shown in FIGS. 1A, 1B, 2A, and 2B with the above-mentioned structure, a wavelength selective film etc. may be applied to the resonator mirror 5 or 12, or the reflecting portion 8 for bending, to achieve high transmittance for the converted wave. Accordingly, the converted wave is output to the outside as indicated by arrow L2. The converted wave is the transverse-multimode light, which is a beam with low coherency. Using an integrator optical system (not shown), the beam can be easily converted into a beam having a top-hat profile, i.e., a beam having a substantially uniform intensity distribution in the longitudinal direction. The converted wave is used as a light source for annealing, thereby performing annealing with reduced spatial and temporal variations in intensity. For example, when the converted wave is used in a polycrystalline or microcrystalline process of silicon for a thin-film transistor (TFT), variation in grain sizes of a Si substrate can be reduced if the intensity of the laser beam is uniform within the beam. Thus, a TFT with high mobility can be provided.

Since the output light obtained by the laser light source device is the transverse-multimode light, reduced overlaps of mode profiles between transverse modes can prevent the typical problem of mode competition caused by inter-mode nonlinear coupling in an internal-resonance wavelength conversion device. Hence, it is not necessary to address the mode competition by other methods, such as increasing the length of a resonator, or using a wavelength selective element, such as a quarter-wave plate or a birefringent filter. Therefore, a laser light source device with reduced noise and stable output can be provided without being increased in size or being complicated.

In the laser light source device 100 of this embodiment, the resonator mirror 12 may be preferably configured to have a reduced reflectance so as to slightly transmit the fundamental wave by a transmittance, for example, in a range of from 0.5% to 1%. With this reflectance setting, part of high power oscillated in the resonator 30 is extracted to the outside of the resonator 30. Accordingly, in addition to the converted wave, the fundamental wave is output to the outside as indicated by arrow L1, and it can be used as the above-mentioned light source for annealing for example. The fundamental wave power in the resonator 30 is typically higher than that of the converted wave by several orders of magnitude. A loss of the resonator caused by taking part of the fundamental wave power is very small. Although the output is decreased by a certain amount, the converted wave can be still sufficiently extracted. Thus, if the proper transmittance is set for the fundamental wave, the fundamental wave and the converted wave can be extracted by a proper ratio.

In the example shown in FIGS. 1A and 1B, the reflecting portion 8 for bending, formed of the concave mirror, is highly transmissive for the converted wave and highly reflective for the fundamental wave, to output the converted wave emitted from the wavelength conversion element 10 to the outside through the reflecting portion 8. In contrast, the wavelength selective film 11 of the resonator mirror 12 arranged near the wavelength conversion element 10 is highly reflective for the converted wave and partly transmits the fundamental wave, to output the fundamental wave in a direction opposite to the direction of the converted wave. With such configuration, lights with two wavelengths can be extracted in different directions.

In contrast, in the example shown in FIGS. 2A and 2B, lights with different wavelengths, in this case, the fundamental wave and the converted wave, are output in the same direction. Referring to FIGS. 2A and 2B, the resonator mirror 5, to which the light is incident from the pump light source 1, and the reflecting portion 8 for bending are highly reflective for the fundamental wave. The resonator mirror 12 near the wavelength conversion element 10, in particular, the wavelength selective film 11, is highly transmissive for the converted wave and partly transmits the fundamental wave. In this case, the lights with two different wavelengths can be extracted by the resonator mirror 12 in directions indicated by arrows L1 and L2.

When crystal for wavelength conversion by noncritical phase matching or quasi phase matching such as periodical poling is used, the fundamental wave and the converted wave have the same energy propagation direction. In other words, when a wavelength conversion element of typical critical phase matching using birefringence is used, the fundamental wave and the converted wave have different energy propagation directions because of the effect of walk-off. In contrast, when the crystal for wavelength conversion by quasi phase matching is used, an optical system for correcting a shift between optical axes of the fundamental wave and the converted wave does not have to be provided. Lights with two wavelengths can be used coaxially. This is markedly advantageous because the design of the optical system is facilitated when two wavelengths are used as a laser annealing light source. When a wavelength conversion crystal with a larger crystal length is used, higher conversion efficiency can be obtained.

Figure 3A:
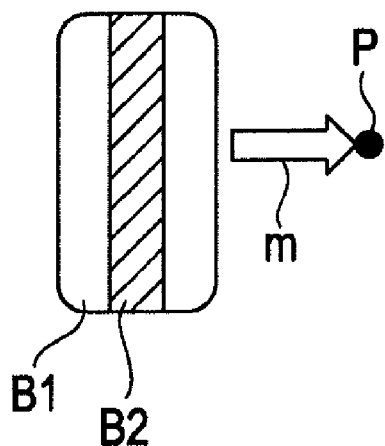
FIG. 3A is a plan view schematically showing the beam profile of example output light from a laser light source device.

Referring to the example shown in FIGS. 2A and 2B, when the fundamental wave and the converted wave are output in the same direction, the following advantage can be attained. When such lights with different wavelengths are output in the same direction, the lights may have different beam diameters at positions upstream and downstream of the wavelength conversion. Hence, a plane shape of the beams, in which the fundamental wave and converted wave condensed in the short-axis direction are overlapped with each other, has a pattern such that the beam B2 of the converted wave is arranged at a center portion in the short-axis direction of the beam B1 of the fundamental wave as shown in FIG. 3A. In FIG. 3A, the beam profiles of the fundamental wave and converted wave are illustrated as profiles close to a rectangle. The profile can be easily provided by an optical system such as an integrator with respect to the long-axis direction.

To be more specific, wavelength conversion efficiency is typically proportional to a power density of a fundamental wave. In the short-axis direction of a line beam whose fundamental wave is Gaussian mode, the conversion efficiency is the highest at the center of the beam of the fundamental wave. The conversion efficiency is decreased toward the periphery of the beam along the Gaussian profile. Thus, the beam diameter may become decreased in the short-axis direction of the beam of the converted wave. Further, a diffraction-limited beam diameter may vary depending on the wavelength. A light with a long wavelength and a light with a short wavelength have different beam profiles. The beam profile of the light with the long wavelength contains the beam profile of the light with the short wavelength. In this embodiment, the transverse-multimode wave conversion is applied in the long-axis direction. The beam profile of the fundamental wave is a smooth profile which is close to the top-hat profile rather than the Gaussian profile. The distribution of the conversion efficiency also appears as the smooth profile close to the top-hat profile.

Furthermore, attenuation of the fundamental wave has a shape close to the top-hat profile, likely resulting in the beam profile of the converted wave, such as the second harmonic wave, being close to the top-hat profile with an equivalent size to that of the fundamental wave. As described above, the long-axis beam diameters of the fundamental wave and converted wave using the transverse multimode do not significantly differ from each other, and may have substantially uniform profiles of the fundamental wave and converted wave. Thus, the beam pattern becomes the example shown in FIG. 3A.

Figure 3B:
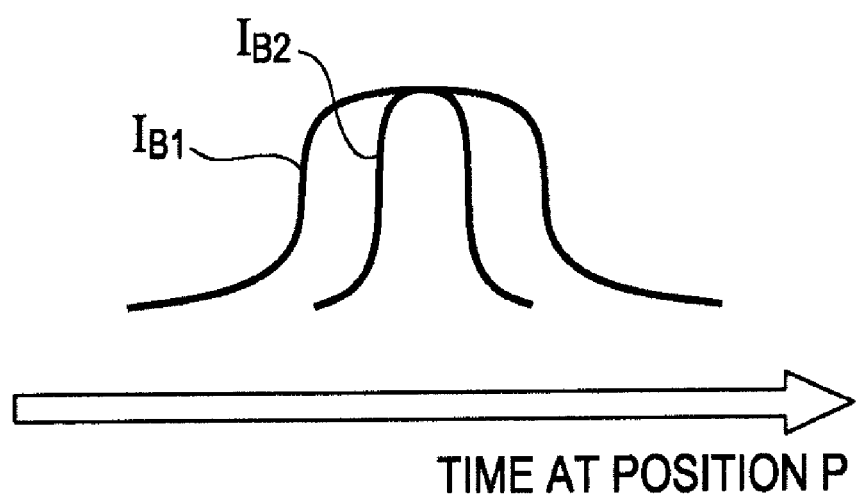
FIG. 3B illustrates examples of time changes when beams are emitted, according to an embodiment of the invention.

A beam in which the fundamental wave and the converted wave are combined is moved relative to a position P in the short-axis direction as indicated by arrow m. At this time, referring to FIG. 3B, when the horizontal axis plots the time at the position P, a shift may appear between an intensity variation $I_{B1}$ of the fundamental wave and an intensity variation $I_{B2}$ of the converted wave. That is, by combining the fundamental wave and the converted wave and moving the condensed line transverse-multimode beam in the short-axis direction, the fundamental wave and the converted wave can be emitted at the position P by time-delay irradiation although irradiation of the fundamental wave and the converted wave is simultaneously performed.

As described above, with the laser light source device of this embodiment, the line beam in which the fundamental wave and the converted wave are combined scans a substance as an irradiation subject in the direction perpendicular to the line direction (longitudinal direction). Accordingly, a process, such as uniform laser annealing, can be provided. Also, since the beam diameter in the short-axis direction of the fundamental wave is larger than that of the converted wave, a substrate such as a Si substrate can be preheated or slowly cooled. The advantage can be attained even after the uniform top-hat profile is provided by an integrator such as a fly-eye lens, by using the low coherency of the laser light source device of this embodiment.

With this embodiment, time-delay irradiation can be carried out by performing irradiation while the lights with different wavelengths are temporarily shifted from each other although simultaneous irradiation is performed without a complicated optical system for an optical-path difference. In the laser light source device of this embodiment, the lights with the different wavelengths can be easily emitted with a desirable time difference by properly selecting wavelengths of output lights and selecting the moving directions of the output lights relative to the substance such as a semiconductor substrate.

Also, in the laser light source device of this embodiment, since the line transverse-multimode beam is used, low coherency can be achieved. Even when the plurality of fundamental waves and the plurality of converted waves coaxially propagate, coherence hardly occurs in the fundamental waves and in the converted waves, and coherence hardly occurs between the fundamental waves and the converted waves. Further, a phase relationship hardly occurs, and intensity variation noise or beam profile variation hardly appear.

In the case of lights with high coherency, when lights with different wavelengths are combined, periodical construction and periodical destruction occur as shown in FIGS. 4A and 4B. FIG. 4A illustrates an example in which phases are aligned at certain points. FIG. 4B illustrates an example in which phases are not aligned. In these examples, a maximum amplitude appears in FIG. 4B.

When the lights with high coherency are combined, if one wavelength is twice (half) the other wavelength, such as a relationship between a fundamental wave and a second harmonic wave, a pattern of periodic intensity variation may appear not due to coherence, but due to the phase relationship. If the lights with the different wavelengths are used for processes for different effects, the pattern of periodic intensity variation is not a significant problem. However, if a synergetic effect is expected, the pattern of periodic intensity variation may affect a process. For example, regarding application to annealing or the like in a process of Si crystallization for a thin-film transistor, the pattern of periodic intensity variation may cause crystal grains varying.

In contrast, in this embodiment, since the transverse-multimode fundamental wave pumped with the transverse-multimode light and the converted wave are combined, the variation due to the phase relationship between the two wavelengths can be markedly decreased. That is, in the laser light source device of this embodiment, by using the transverse-multimode light, the lights with the two wavelengths with the uniform top-hat beam profiles can be easily obtained by using an integrator optical system etc., because of the effect of low coherency. Unfortunately, the lights with the two wavelengths with the uniform top-hat beam profiles is not obtained by a two-wavelength laser in the past, i.e., a two-wavelength laser in which a fundamental wave and a harmonic wave, obtained through the wavelength conversion process from a single-mode light source, are combined and output, because the two-wavelength laser has high coherency.

In the example shown in FIGS. 1A and 1B, one of converted waves, such as the second harmonic wave emitted from the wavelength conversion element 10 to both sides along the resonance optical path, is bent. That is, in the example shown in FIGS. 1A and 1B, the converted wave is reflected by the resonator mirror 12, both the converted waves are combined, and the combined wave is output to the outside. By bending and outputting one of the converted waves output to both sides, light utilization efficiency can be increased.

At this time, if the converted waves are combined within a coherence length, the beam profile may be changed and noise may be increased by the coherence. In this case, one of the converted waves may be extracted to the outside of the resonator, the extracted wave may propagate by a distance of a temporal coherence length or larger by a reflecting portion such as a concave mirror arranged at the outside, i.e., by an external reflecting portion, and then the wave may be returned to the inside of the resonator. The one converted wave propagates by the temporal coherence length or larger, then the other converted wave is overlapped with the one converted wave, and then the converted waves are extracted in the same direction. Hence, the beam profile can be prevented from being changed due to the coherence, and noise can be decreased. Meanwhile, in FIGS. 2A and 2B, the converted wave, which could have been lost by passing through the reflecting portion 8 at high transmittance (described later), can be re-used.

Figure 5A:
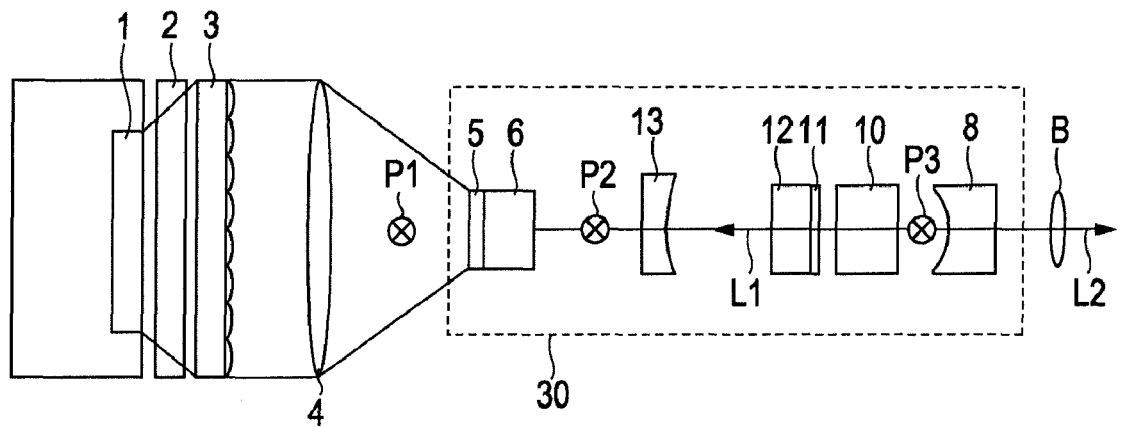
FIGS. 5A and 5B are configuration diagrams briefly showing a laser light source device according to an embodiment of the invention.
Figure 5B:
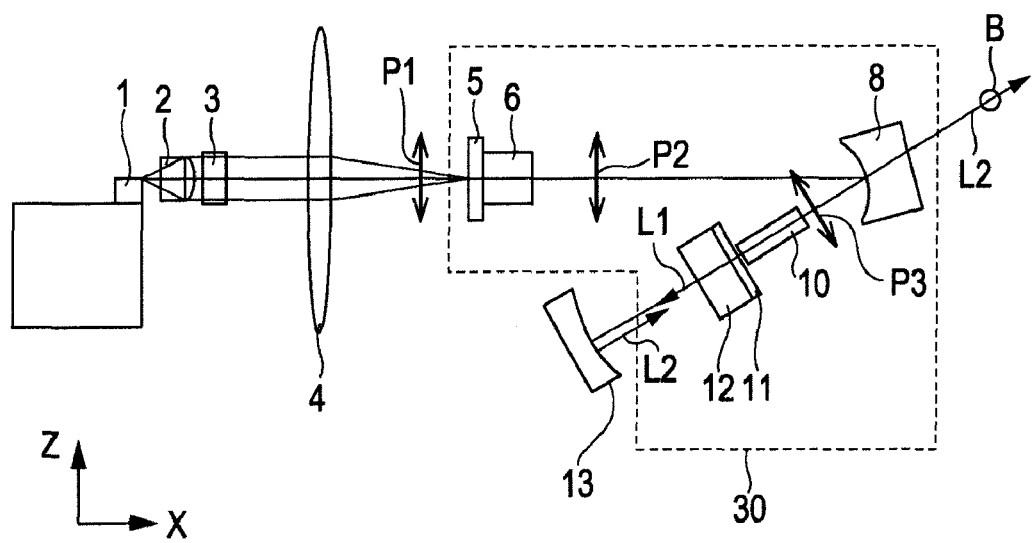

FIGS. 5A and 5B are configuration diagrams briefly showing an embodiment in which an external reflecting portion is provided. Similarly to the example shown in FIGS. 1A and 1B, a fundamental wave and a converted wave are output in different directions. Referring to FIGS. 5A and 5B, like numerals refer like components corresponding to those in FIGS. 1A and 1B, and redundant description is omitted. In FIGS. 5A and 5B, a resonator mirror 12 near the wavelength conversion element 10 is not highly reflective but is highly transmissive for the converted wave. An external reflecting portion 13 formed of, for example, a concave mirror, and arranged outside the resonator is provided at a distance of the temporal coherence length or larger in the laser light source device 100. The external reflecting portion 13 is highly transmissive for the fundamental wave and is highly reflective for the converted wave. With this structure, the converted wave can be combined with a converted wave generated toward the reflecting portion 8 for bending in the wavelength conversion element 10. Since the concave mirror is used as the external reflecting portion 13, the two converted waves can have similar beam profiles and waist positions.

Figure 6:
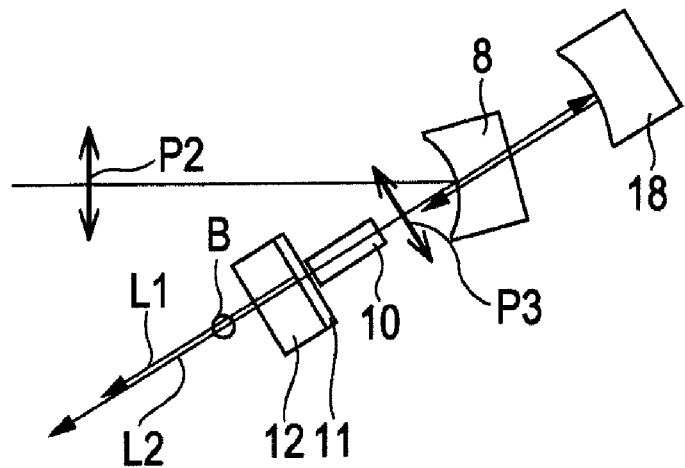
FIG. 6 is a configuration diagram briefly showing a laser light source device according to an embodiment of the invention.

FIG. 6 shows a case where a fundamental wave and a converted wave are output in the same direction in a similar manner to FIGS. 2A and 2B. Referring to FIG. 6, like numerals refer like components corresponding to those in FIG. 2B, and redundant description is omitted. As shown in FIG. 6, in this example, a reflecting portion 8 for bending, which is a concave mirror, is highly transmissive for the converted wave. An external reflecting portion 18, which is a concave mirror, is arranged outside the reflecting portion 8 and is highly reflective for the converted wave. In this case, the converted wave emitted from the wavelength conversion element 10 toward the reflecting portion 8 is extracted to the outside of the resonator 30 once, reflected by the external reflecting portion 18, is returned to the inside of the resonator 30, and is incident on the wavelength conversion element 10 again. Then, the returned converted wave is combined with a converted wave emitted from the wavelength conversion element 10 in an opposite direction, i.e., toward the resonator mirror 12. The combined wave is output to the outside from the resonator mirror 12 in the same direction as the direction of the fundamental wave.

Figure 7:
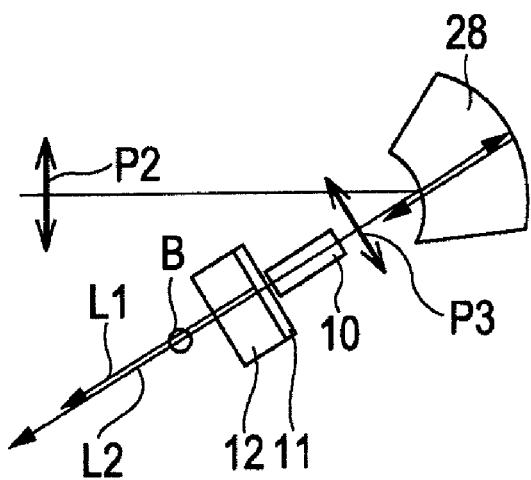
FIG. 7 is a configuration diagram briefly showing a laser light source device according to an embodiment of the invention.

As shown in FIG. 6, the external reflecting portion 18 may be a concave mirror or the like, which is disposed outside the resonator 30 and is highly reflective for the converted wave. Alternatively, as shown in FIG. 7, a reflecting portion 28 may be provided in the resonator 30 such that the rear surface of the reflecting portion 28 is convex and is highly reflective for the converted wave.

To further effectively decrease the coherence, the two beams of the converted waves may be combined in a spatially slightly shifted manner. In particular, the waves may be combined after being shifted from each other by a spatial coherence length or larger by shifting the external reflecting portion such as a concave mirror from the optical axis. The external reflection portion may be two plane mirrors or a prism.

A spatial shift necessary for reliably decreasing the coherence of harmonic waves and obtaining a stable output may typically vary depending on the number of longitudinal and transversal modes of laser light, the characteristic of a laser, and the application of a converted wave, namely, the type of optical apparatus to be applied. In general sense, the beam shift may be a value obtained by decreasing a visibility of interference fringes (interference fringe contrast) to about $1/e^2$, the interference fringe being generated by shifting the optical axes from each other and being overlapped with each other with respect to the condition in which the optical axes of the two converted-wave beams are combined to be coherent with each other. That is, the shift may be at least the spatial coherence length.

With the above configuration, the three beams of the converted waves in the two directions generated by the wavelength conversion element and the fundamental wave can be highly efficiently and substantially coaxially extracted by the single mirror arranged outside the resonator by a simple layout.

The wavelengths of the fundamental wave and converted wave in this embodiment are determined by a laser crystal and its pumping wavelength, and a nonlinear optical process relating to wavelength conversion. For example, when the laser crystal is a $Nd:YVO_4$ crystal, and the pumping wavelength is about 808 nm, the wavelength of the fundamental wave is about 1064 nm. In this case, when the nonlinear optical process selects second harmonic generation, the wavelength of the converted wave is about 532 nm. This is shorter than the wavelength provided by an existing semiconductor laser output with several watts or higher.

Typically, absorption of a substance increases as the wavelength becomes shorter toward the absorption edge. This is also applied to an absorption coefficient of a material, for example, amorphous Si, as a subject of a process such as laser annealing. Thus, since the wavelength of 532 nm is shorter than the wavelength of the existing high-output semiconductor laser, the converted wave is absorbed by a larger quantity. Thus, the temperature of the amorphous Si at that part is effectively increased. The converted wave heats Si more effectively than the fundamental wave with the wavelength of 1064 nm does. In contrast, an absorption coefficient for the wavelength of 1064 nm is small, however, the fundamental wave penetrates in a depth direction of the crystal. That is, the substrate is gently heated by a depth larger as compared with the case of the converted wave, dissipation of the heat generated by absorption of the converted wave can be prevented.

Also, in the short-axis direction of one-dimensional transverse multimode, the beam diameter of the fundamental wave is lager. Thus, an area at front and rear sides (in the short-axis of the line beam) and an area in a depth direction of a position, which is irradiated with the light with the wavelength of 532 nm and the temperature of which is increased, is gently heated with the light with the wavelength of 1064 nm. An advantage of preventing the dissipation of the heat generated by the absorption can be attained, in addition to the preheating and slow cooling effects. Accordingly, an effective and efficient laser annealing process can be achieved. Also, uniformity of the laser annealing process, increase in throughput can be achieved. Further, a deformation due to a difference in thermal expansion can be prevented.

It should be noted that a laser crystal, a wavelength conversion crystal, a resonator configuration (the number of resonator mirrors, their arrangements, and their curvature radii) are not limited to those described in the embodiment and illustrated in the drawings. As long as proper material and configuration are used, a laser light source with a combination of a shorter wavelength and a longer wavelength can be provided.

In this embodiment, oscillation with a laser resonator may be continuous wave oscillation. With this configuration, variation in energy among pulses generated by an excimer laser, which uses pulse oscillation, can be avoided, and beams with a high temporal uniformity can be obtained. When an excimer laser is used, to avoid variation in process due to the variation in energy, a pulse repetition rate is set for equalization. The repetition rate limits a scanning speed. However, with the embodiment, no limit is necessary and the scanning speed can be desirably selected. Also, since the laser light has a small output variation, the characteristic of the laser light, for example, mobility, can be increased by increasing the average crystal grain diameter, and variation in characteristic can be decreased by decreasing variation in the crystal grain diameter.

[2] Second Embodiment

Next, a laser light source device according to a second embodiment of the invention will be described. FIGS. 8A and 8B are configuration diagrams briefly showing the laser light source device according to the second embodiment.

In this embodiment, a pulse generating mechanism, such as a Q switch element or a saturable absorber, is provided in the laser light source device of the first embodiment. Alternatively, in this embodiment, an application current to the pump light source such as a laser diode is directly modulated. With this configuration, a fundamental wave and a converted wave from the resonator are extracted as pulse oscillation light. In FIGS. 8A and 8B, like numerals refer like components corresponding to FIGS. 1A and 1B, and redundant description is omitted. FIGS. 8A and 8B show an example in which a pulse generating mechanism 20 formed of a Q switch element or a transmissive saturable absorber like Cr:YAG is arranged between the laser medium 6 and the reflecting portion 8 in the resonator 30. Regarding the pulse generating mechanism, the saturable absorber made of semiconductor may be attached to any of reflection surfaces of the reflecting portion 8, the resonator mirror 12, or the like.

The wavelength conversion efficiency becomes higher as the power density of the fundamental wave becomes higher. For example, in an area with a low conversion efficiency such that attenuation of the fundamental wave is negligible, the efficiency increases in proportion to the power density of the fundamental wave. Thus, the conversion efficiency at a position near a peak value of pulse light is significantly high. Particularly when a laser process such as laser annealing as a subject process becomes highly responsive by the peak power density rather than an average power density, laser annealing is desirably performed using pulse light. In this case, the number of times for pulse irradiation at the same position of a material may be increased and averaged in accordance with uniformity of power density for the process.

In this embodiment, when only the converted wave is output to the outside and the wavelength selective film 11 is highly reflective for the fundamental wave, the following advantage can be obtained. Since the converted wave with a low coherency of the transverse multimode can be obtained, a laser light source device capable of easily providing a stable beam of top-hat profile is provided. Since the transverse-multimode oscillation is employed, the stability is provided by a small number of components. Thus, a compact laser light source device can be produced. With the reduced number of components, a loss in the resonator is small, and hence a highly efficient laser light source device can be provided.

FIGS. 8A and 8B show an example in which an additional wavelength conversion element 9 is arranged in the resonator 30. The wavelength conversion element 9 generates a converted wave, such as a third harmonic wave, when being irradiated with the fundamental wave and the converted wave. In this embodiment, the fundamental wave generated such that the light emitted from the laser medium 6 with the pump light is oscillated in the resonator 30, and the converted wave, such as a second harmonic wave, generated such that the wavelength conversion element 10 is irradiated with the fundamental wave, are based on pulse oscillation, thereby having high peak power densities. Thus, by additionally arranging the properly designed wavelength conversion element 9, the converted wave such as the third harmonic wave (sum frequency) can be efficiently generated.

For example, when the resonance wavelength in the resonator (initial fundamental wave) is 1064 nm, the wavelength of the second harmonic wave generated in the resonator 30 is 532 nm. Hence, the wavelength of the third harmonic wave with respect to the initial fundamental wave, that is, the wavelength of the sum frequency for the initial fundamental wave and the second harmonic wave generated in the resonator 30 becomes 355 nm. For example, the laser medium 6 employs Nd:YAG or Nd:YVO$_4$, the wavelength conversion element 10 for initial conversion of the second harmonic generation or the like employs MgO—PPSLN or MgO—PPSLT, and the wavelength conversion element 9 for generating the third harmonic wave or the like employs LBO or BBO. With the configuration, the third harmonic wave, which is the sum frequency of the fundamental wave and the converted wave of the initial second harmonic generation can be obtained. The wavelength selective film 11 is highly transmissive for the third harmonic wave. In this case, a light source for laser annealing or the like with a shorter wavelength can be achieved. For example, crystallization can be effectively performed with a wavelength corresponding to a larger absorption coefficient of the Si material of the TFT substrate.

At this time, the wavelength conversion element 9 for the third harmonic generation, and the wavelength conversion element 10 for the second harmonic generation may be arranged in that order from a position near the resonator mirror 12. With this configuration, the generated second harmonic wave is combined with the fundamental wave in the resonator 30 advancing in the same direction, and hence the third harmonic wave is generated. The generated third harmonic wave is not incident on the wavelength conversion element 10 for the second harmonic generation. Thus, the wavelength conversion element 10 for the second harmonic generation may absorb the third harmonic wave by a certain amount. That is, the material of the wavelength conversion element 10 may be relatively desirably selected. In addition, the design of the wavelength selective film for the wavelength conversion element 10 may be simple. Though not shown, the second harmonic wave generated toward the reflecting portion 8 is reflected by the external reflecting portion arranged at the outside to reflect the second harmonic wave, as described above with reference to FIGS. 6 and 7. That second harmonic wave may be combined with the second harmonic wave generated toward the resonator mirror 12, may be incident on the wavelength conversion element 9 for the third harmonic generation, and may be combined. Also, the positions of the wavelength conversion elements 9 and 10 may be inverted, the transmittance and the reflectance of the resonator mirrors may be properly selected, and the second harmonic wave and the third harmonic wave may be output from the reflecting portion 8.

As described above, in this embodiment, the fundamental wave, the second harmonic wave, and third harmonic wave can be output by a proper power ratio by selecting the design of the mode diameter in the resonator, wavelength conversion crystal length, crystal insertion position, pulse condition, and transmittance of the wavelength selective film 11. When the configuration is applied to a TFT manufacturing process as described in the first embodiment, preheating and slow cooling effects of a substrate can be provided, and heat generated by gentle heating in the depth direction of the substrate can prevent heat from being dissipated, as compared with the case where only the fundamental wave and the second harmonic wave are used, or only the fundamental wave and the third harmonic wave are used. Absorption of the amorphous Si for wavelengths is rapidly increased from the infrared region, visible region, to ultraviolet region. Thus, when the wavelengths of the second and third harmonic waves are selected as 532 nm and 355 nm, the preheating and slow cooling effects become further effective. In other words, since the process uses at least the two wavelengths, equalization of crystal grains can become further effective when the configuration is applied to the laser annealing process. As a result, the characteristic of a TFT as a subject can be increased. By properly selecting the wavelength of light for irradiation, and light quantity ratio between wavelengths when a plurality of wavelengths are used, the process can be optimized in accordance with an expected initial state and an expected form of a substrate material.

The wavelength conversion element in this embodiment involves the different elements for the second harmonic generation and the third harmonic generation in the above description. However, the elements may be the same wavelength conversion element. When the wavelength conversion element using quasi phase matching is formed of a monocrystal, two or more types of periods of poling may be provided for quasi phase matching, thereby providing two wavelength conversion processes with a single element. For example, a pitch of a periodic poling structure may be set to correspond to quasi phase matching for the second harmonic generation in a former half section near the reflecting portion 8 of the wavelength conversion element 10, and a pitch of a periodic poling structure may be set to correspond to quasi phase matching for the sum frequency generation for the third harmonic generation in a latter half section opposite to the former half section. With the configuration, the number of components can be decreased, and a time necessary for optical adjustment can be decreased.

Figure 9A:
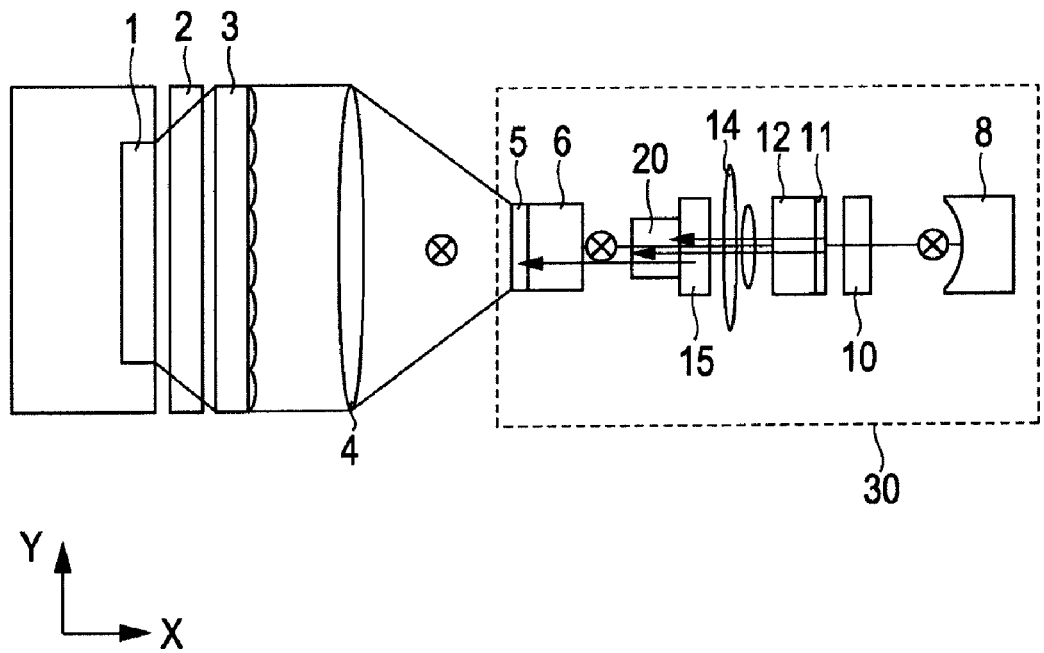
FIGS. 9A and 9B are configuration diagrams briefly showing a laser light source device according to an embodiment of the invention.
Figure 9B:
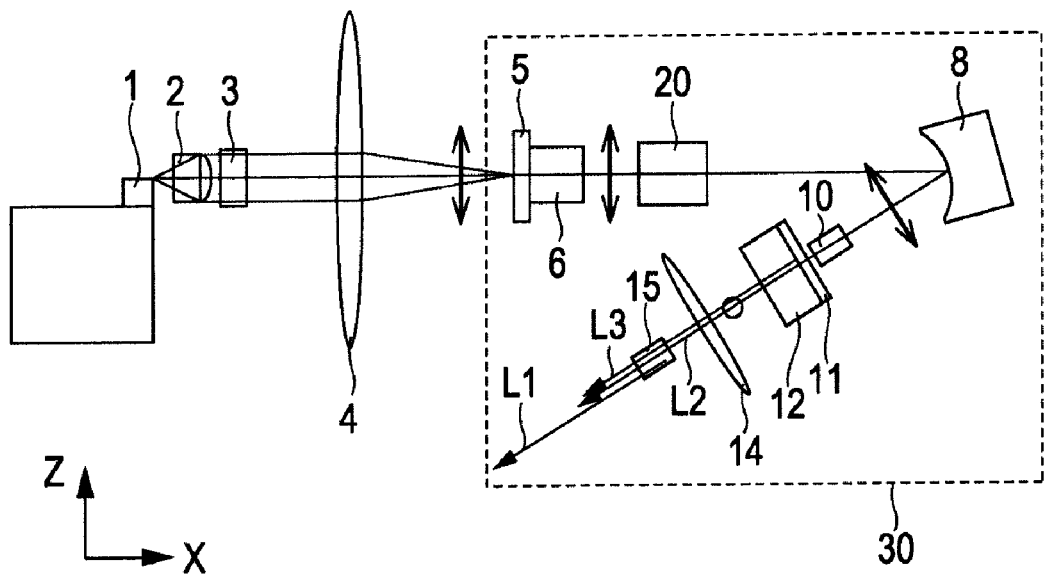

FIGS. 8A and 8B show the example in which the wavelength conversion element for the third harmonic generation is arranged in the resonator 30. Alternatively, referring to FIGS. 9A and 9B, a wavelength conversion element 15 for the third harmonic generation may be arranged outside the resonator 30. In this example, the configuration of the first embodiment described with reference to FIGS. 1A and 1B is employed to generate the fundamental wave and the second harmonic wave, and a pulse generating mechanism 20 such as a Q switch or a transmissive saturable absorber is provided in the resonator 30. The pulse generating mechanism 20 performs pulse oscillation. Thus, the peak power density is increased by pulse oscillation, the emitted fundamental wave and harmonic wave are extracted to the outside of the resonator 30, the waves are incident on the wavelength conversion element 15 for the third harmonic generation through the condenser lens 14. With this configuration, relatively highly efficient conversion can be provided with the high conversion coefficient of the peak power of the pulse even in the case of the sum frequency generation with one path.

Figure 10:
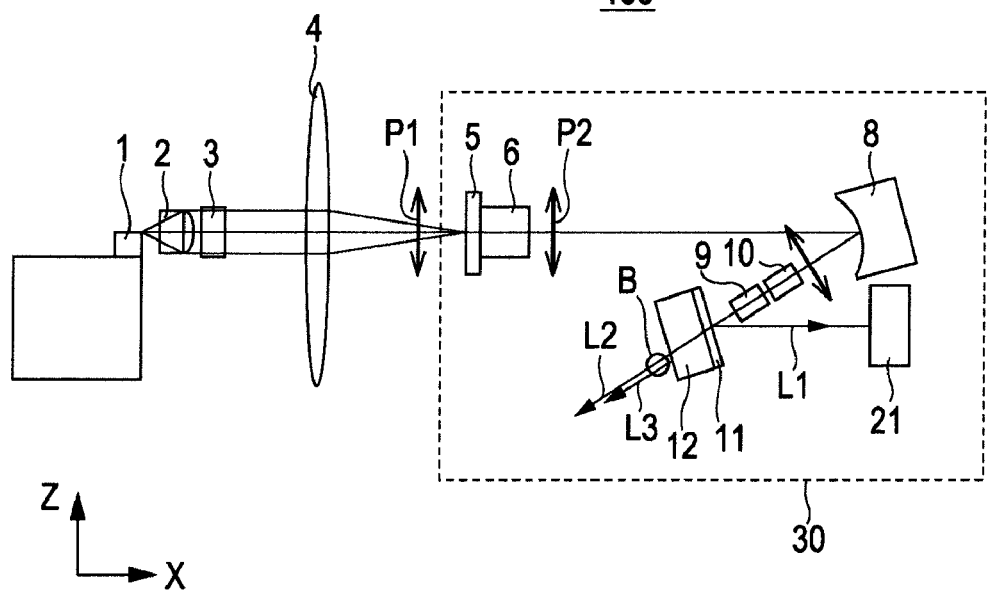
FIG. 10 is a configuration diagram briefly showing a laser light source device according to an embodiment of the invention.

Referring to FIG. 10, a modification may have a similar configuration to the example shown in FIGS. 8A and 8B, in which the second and third harmonic waves are generated. However, only the fundamental wave may be reflected by the resonator mirror 12 in a different direction. In FIG. 10, like numerals refer like components corresponding to those in FIG. 8B and redundant description is omitted. In this case, the fundamental wave reflected by the resonator mirror 12 is incident on a pulse generating mechanism 21 formed of a reflective Q switch element or a saturable absorber, and is reflected to the resonator mirror 12 again. In this case, the converted waves of only the two types of the second and third harmonic waves may be extracted to the outside.

Figure 11:
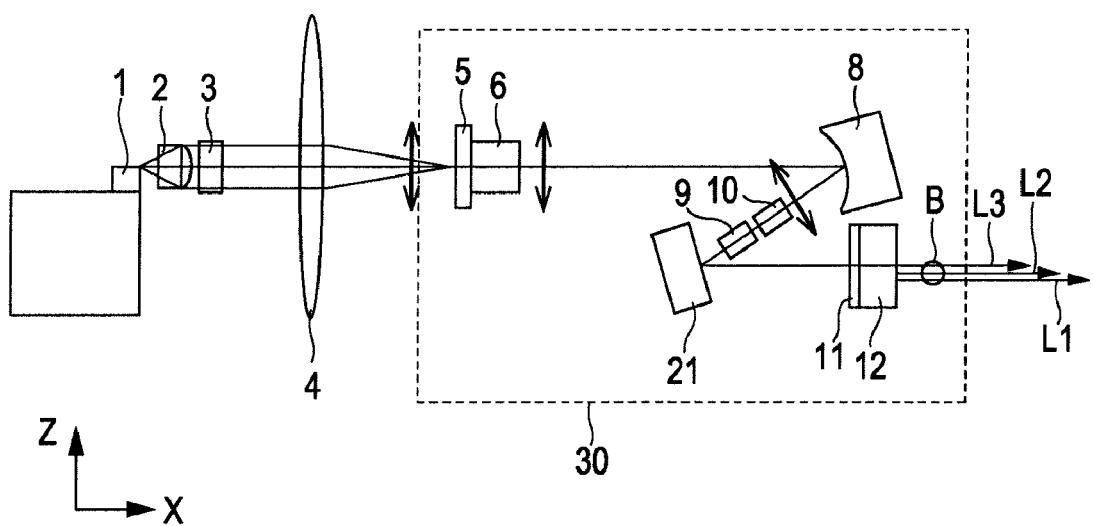
FIG. 11 is a configuration diagram briefly showing a laser light source device according to an embodiment of the invention.

Further, the pulse generating mechanism 21 formed of a reflective Q switch or a saturable absorber may be arranged at a position of the reflecting portion 8 as shown in FIGS. 8A and 8B, to reflect the fundamental wave. The wavelength conversion element 10 and the wavelength conversion element 9 may be arranged downstream of the pulse generating mechanism 21 so that the fundamental wave is incident on the resonator mirror 12. In this case, the fundamental wave, and the two types of the converted waves of the second and third harmonic waves can be output in a direction substantially parallel to the advancing direction of the initial pump light, as indicated by arrows L1 to L3. Referring to FIG. 11, the pulse generating mechanism 21 may be arranged at the position of the resonator mirror 12 in FIGS. 8A and 8B, to reflect the fundamental wave, the wavelength conversion element 10 and the wavelength conversion element 9 may be arranged downstream of the pulse generating mechanism 21, and the fundamental wave may be incident on the resonator mirror 12. In FIG. 11, like numerals refer like components corresponding to those in FIG. 8B, and redundant description is omitted.

With this embodiment shown in FIGS. 8A to 11, the fundamental wave and the second harmonic wave can be coaxially incident on the wavelength conversion element for the third harmonic generation. This embodiment is suitable for the sum frequency generation. Referring to the example in FIGS. 9A and 9B, when the beam is properly shaped and condensed before the beam is incident on the wavelength conversion element for the third harmonic generation, a sufficient wavelength conversion efficiency can be provided. In this case, the power density may be adjusted to a value which does not cause damage on the surface of the wavelength conversion element or in the wavelength conversion element.

Further, a wavelength conversion element for fourth harmonic generation may be used instead of the wavelength conversion element for the third harmonic generation arranged inside or outside the resonator 30. In this case, a line beam of second harmonic wave generated in the resonator 30 is reused as the fundamental wave, and the second harmonic wave of the reused fundamental wave provides a fourth harmonic wave for the initial fundamental wave. For example, when the resonance wavelength in the resonator (initial fundamental wave) is 1064 nm, the wavelength of the second harmonic wave generated in the resonator is 532 nm. Hence, the wavelength of the fourth harmonic with respect to the initial fundamental wave, that is, the wavelength of the second harmonic wave for the second harmonic wave generated in the resonator 30 becomes 266 nm.

In this embodiment, while the two-step wavelength conversion uses the pulse oscillation, of course, continuous wave oscillation may be used as long as necessary conversion efficiency is attained.

[3] Third Embodiment

Next, examples of a laser irradiation apparatus according to a third embodiment of the invention will be described with reference to FIGS. 12A through 15B. In each example, the laser light source device described in any of the first and second embodiments can be used. The example may be applied to a laser annealing process of amorphous Si or the like for a thin-film transistor (TFT). By performing scanning in the short-axis direction with converted light from the laser light source device or a line laser beam including converted light and fundamental light, a desirable temperature change process like slow cooling process can be provided in the annealing process as described above. That is, by using the laser irradiation apparatus as a laser process apparatus, uniformity of a TFT can be kept and the performance of a TFT can be improved.

FIGS. 12A to 12D are configuration diagrams briefly showing a laser irradiation apparatus 200 according to this embodiment. In each example, the laser light source device 100 is used. A substance 50 (irradiation subject) to be irradiated with laser light is arranged on a stage 60, and the laser light source device 100 is arranged above the substance 50. An optical system 104 may be optionally provided between the laser light source device 100 and the substance 50. The optical system 104 properly performs beam shaping by a spherical or aspherical lens, a cylindrical lens, including an integrator if necessary, or a combination of these components.

FIGS. 12A and 12B show an example in which a moving mechanism (not shown) is provided at the laser light source device 100 so that the laser light source device 100 is moved in a direction indicated by arrow M1 while the stage 60 on which the substance 50 as the irradiation subject is fixed. FIGS. 12C and 12D show an example in which a moving mechanism (not shown) is provided at the stage 60 so that the stage 60 is moved in a direction indicated by arrow M2. FIGS. 12A and 12C are plan views along the short-axis direction of the line beam B. FIGS. 12B and 12D are plan views along the longitudinal direction of the line beam. FIGS. 12A to 12D show an example of using a substrate 51 having a thin film 52 such as amorphous Si formed on the surface of the substrate 51.

When such a relatively moving mechanism is provided, the laser light source device 100 may be arranged above the stage 60 only during a laser light irradiation process; otherwise, the laser light source device 100 may be retracted from the position above the stage 60. The arrangement when irradiation is not performed may be any arrangement as long as workability is assured for placing and removal of the substance 50, such as a substrate, on the stage 60 or for maintenance.

With the embodiment, the line beam has a low coherency, and a uniform top-hat profile can be easily achieved by an integrator such as a fly-eye lens. By performing scanning with the laser light in the short-axis direction, uniform laser annealing can be applied to the surface of the substance 50. As a result, when the embodiment is applied to a polycrystalline or microcrystalline process of amorphous Si for example, a TFT with a reduced variation in size of crystal grains and having a high mobility can be provided.

Also, the laser irradiation apparatus of this embodiment is compact and highly efficient. Thus, referring to FIGS. 12A to 12D, the laser light source can be easily arranged above the substance 50 as the irradiation subject. Thus, referring to FIGS. 12A and 12B, annealing can be performed while the laser light source device 100 is moved, thereby increasing the degree of freedom for the design of the apparatus. When laser irradiation is applied to a large substrate, if a moving mechanism for the large substrate is provided, the apparatus may be increased in size although a precise moving mechanism has to be provided. With the embodiment, the laser light source device can be decreased in size, and hence, the laser light source device may be provided with a moving mechanism for scanning. Thus, increase in size of the entire apparatus can be prevented.

Figure 13A:
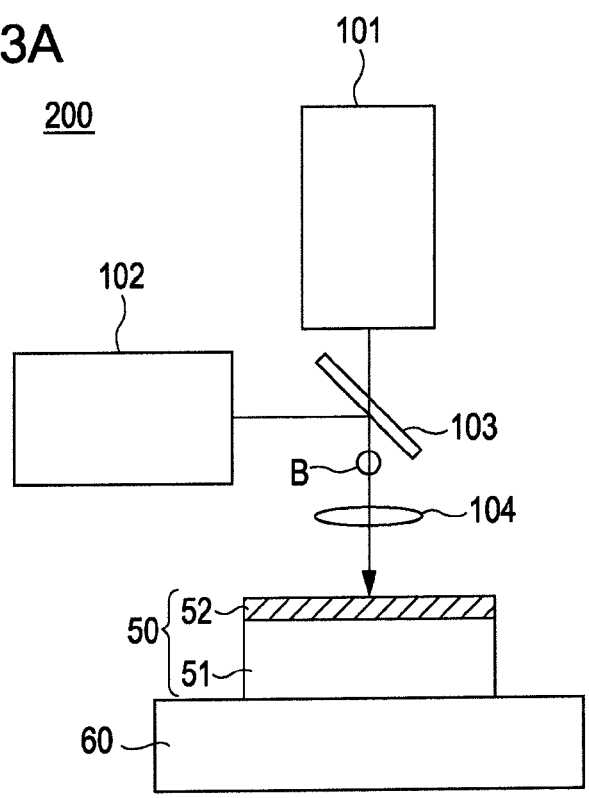
FIGS. 13A and 13B are configuration diagrams briefly showing a laser irradiation apparatus according to an embodiment of the invention.
Figure 13B:
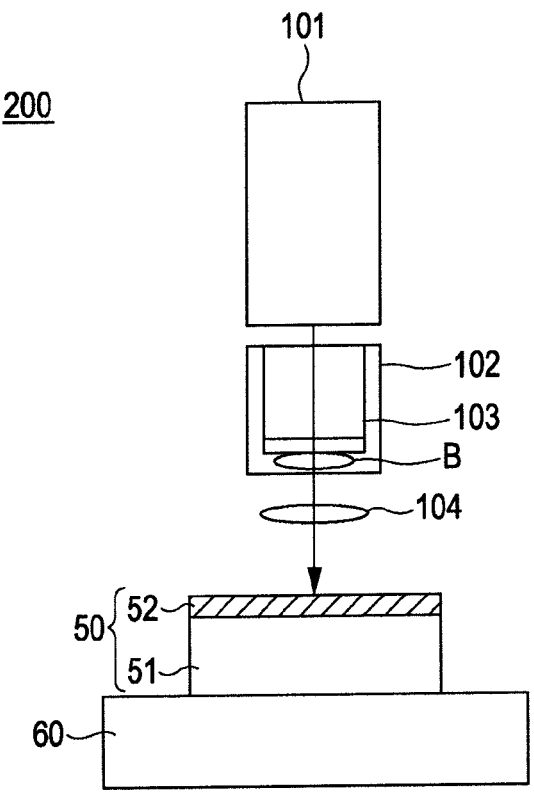

Further, since the laser light source device of this embodiment is compact and highly efficient, a plurality of light source devices can be used, and can be easily arranged in parallel to each other. In the laser irradiation apparatus, the laser light source devices may be arranged in parallel to each other at positions above substances such as semiconductor substances to be processed, modified, and/or exposed. FIGS. 13A and 13B are configuration diagrams briefly showing a laser irradiation apparatus 200, in which two laser light source devices 101 and 102 are used, and laser lights are combined by a polarizing beam splitter 103. In FIGS. 13A and 13B, like numerals refer like components corresponding to those in FIGS. 12A to 12D, and redundant description is omitted. When the laser lights are combined by the polarizing beam splitter 103, polarization of one laser light source device may be rotated by 90 degrees by a half-wave plate (not shown) so that the polarization of the laser light is orthogonal to polarization of laser light of the other laser light source device.

Figure 14A:
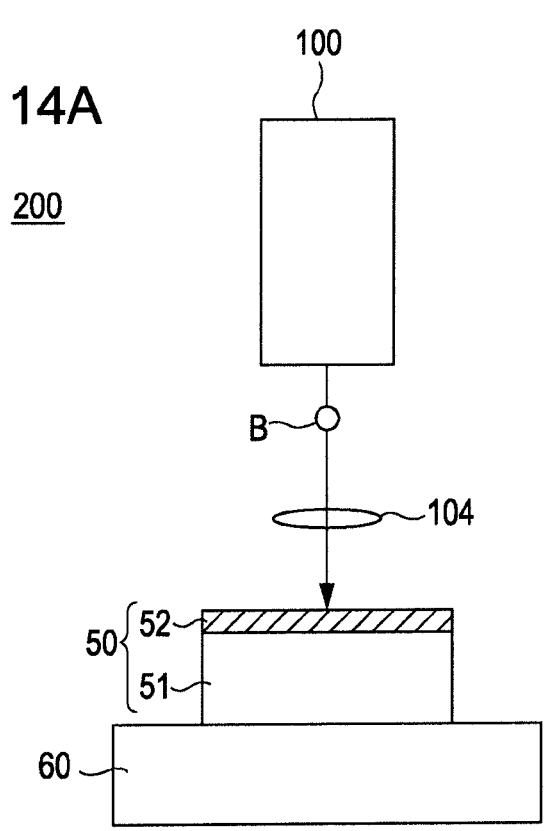
FIGS. 14A and 14B are configuration diagrams briefly showing a laser irradiation apparatus according to an embodiment of the invention.
Figure 14B:
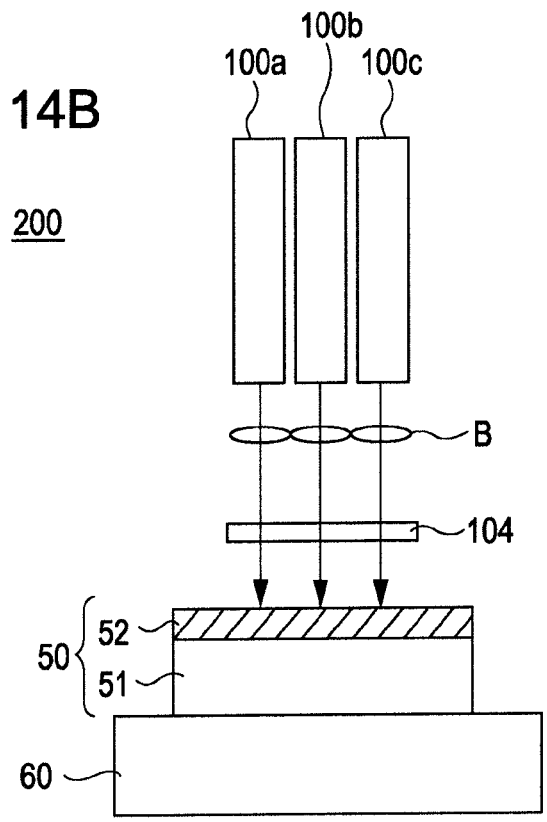
Figure 15A:
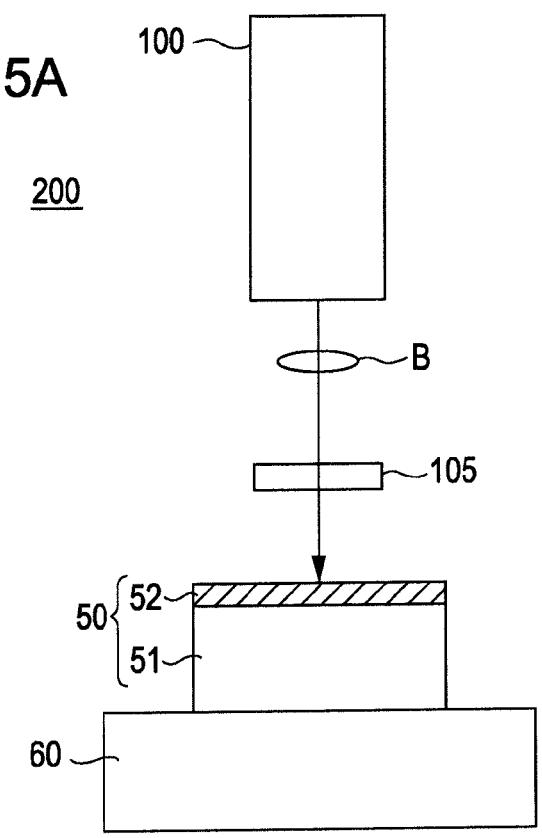
FIGS. 15A and 15B are configuration diagrams briefly showing a laser irradiation apparatus according to an embodiment of the invention.
Figure 15B:
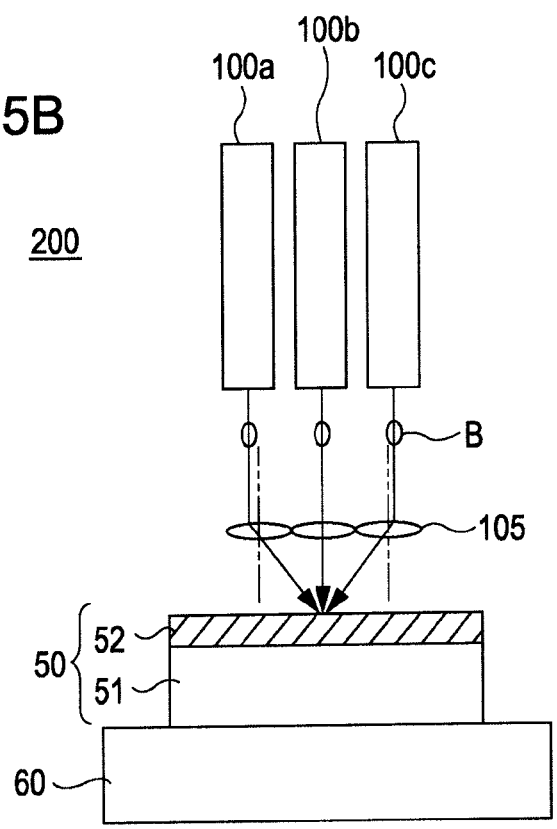

Also, referring to FIGS. 14A, 14B, 15A, and 15B, a laser irradiation apparatus 200 may include laser light source devices 100a to 100c arranged in parallel to each other in the long-axis direction of a line beam. The laser light source devices 100a to 100c may have the same configuration, or different configurations depending on their purposes. That is, laser light source devices that output lights with two or more different wavelengths can be used in a combination. In FIGS. 14A, 14B, 15A, and 15B, like numerals refer like components corresponding to FIGS. 12A to 12D, and redundant description is omitted. When the laser irradiation apparatuses are arranged in parallel to each other, the apparatuses may be arranged in the longitudinal direction as shown in FIGS. 14A and 14B, or in the short-axis direction as shown in FIGS. 15A and 15B. FIGS. 15A and 15B show an example, in which part of laser light may be eccentrically arranged from an optical system 105 such as a lens array. The irradiation angle may be properly selected, and the laser beams may be overlapped with each other on the substance 50. In the situation where the laser beams are overlapped, scanning speed can be increased. Thus, the throughput of the process is increased, i.e., tact time is decreased in a similar manner to a situation where the laser beams are not overlapped. Also, when the laser beams are overlapped with each other, the power density can be increased. A temperature rise can be accelerated by absorption of the laser beam at the irradiation position, thereby increasing the characteristic by improving the process.

As described above, the embodiment provides a laser light source device using internal-resonator wavelength conversion with a pump light source such as a solid laser, but not a gas laser. Thus, by using the laser light source device as a light source for a laser irradiation apparatus such as for laser annealing, the life of the light source is increased with respect to that of an excimer laser light source, a maintenance of exchanging gas is not necessary, and the operation is stable.

The application technique of the laser irradiation apparatus of this embodiment is not limited to the annealing process, an may be a process for thermally, electrically, or chemically modifying, processing, or exposing a material with laser light. For example, if continuous wave oscillation is used, in addition to annealing, the configuration can be applied to plastic processing (for example, cutting), lithography exposure in a semiconductor process, or reading and writing a hologram. If pulse oscillation is used, the configuration can be applied to various processing (punching, cutting, micro machining, abrasion processing, etc.), in addition to annealing, depending on a pulse width and a repetition frequency. A process called laser lithography can also use the configuration with heat at a top of a beam. The substance to be irradiated with the laser beam may be various materials, such as metal, crystal, and resin.

Also, in the laser irradiation apparatus, when the output light of the laser light source device is only the converted wave, since the stable transverse-multimode light with low coherency is used, laser irradiation without noise due to coherence, with a uniform profile, and with stability and high efficiency, is available. For example, when the laser irradiation apparatus is applied to laser annealing for manufacturing a Si thin-film transistor, or other semiconductor thin-film element such as a solar cell or a LSI, a large absorption of the wavelength of the converted wave into a subject material can be utilized, the size of polycrystal Si can be uniform, and variation in mobility can be decreased. When the technique is applied to a process for modifying, processing, exposing a material, stable laser irradiation with high efficiency can be performed.

As described above, in the laser light source device of the embodiment, the wavelength conversion element is provided in the solid laser resonator of transverse-multimode oscillation, and the laser medium is pumped with the transverse-multimode light, thereby oscillating the line beam of fundamental wave. The wavelength conversion element is irradiated with the line beam of fundamental wave, thereby outputting the transverse-multimode line beam of converted wave. As a result, the following advantage can be attained.

1. Since the transverse-multimode converted wave with a low coherency can be obtained, the laser light source device capable of easily providing a stable beam with a top-hat profile can be achieved.

2. Since the stability can be achieved by the transverse-multimode oscillation even with a small number of components, the compact laser light source device can be produced. Also, since the number of components is small, the high-efficient laser light source device with a small loss in the resonator can be achieved.

Also, by allowing one of the resonator mirrors to transmit part of the fundamental wave, the line beam of fundamental wave and the line beam of converted wave can be simultaneously output. As a result, the following advantage can be attained.

3. Since the two wavelengths of the transverse-multimode fundamental wave and converted wave with the low coherency can be simultaneously obtained, the laser light source device capable of easily providing stable beams with top-hat profiles without coherence between the two wavelengths can be achieved.

Further, the fundamental wave and the converted wave can be output from the same resonator mirror. As a result, the following advantage can be attained.

4. The laser light source device capable of coaxially using the fundamental wave and the converted wave without an additional optical system for aligning the propagation optical paths of the fundamental wave and the converted wave, can be achieved.

Also, since the fundamental wave and the converted wave emitted from the same resonator mirror are line transverse-multimode beams obtained through internal-resonator wavelength conversion, the following advantage can be attained.

5. The laser light source device providing the fundamental wave with a beam size in which a beam diameter is substantially uniform in the long-axis direction of the beam and the beam diameter is larger than that of the converted wave in the short-axis direction at a light condensing position, can be achieved.

Also, one of the converted waves generated from the wavelength conversion element along the resonance optical path is once extracted to the outside of the resonator, is returned to the wavelength conversion element by the reflecting portion for bending, and is output together with the other converted wave. As a result, the following advantage can be attained.

6. The high-efficient converted wave generated by the wavelength conversion element is extracted while the coherence or phase relationship with respect to the fundamental wave or the converted wave generated by the wavelength conversion element in the opposite directions is suppressed. Thus, the high-efficient converted wave can be used without coherence or a phase relationship between the converted waves generated by the wavelength conversion element to both sides, or between the two wavelengths of the fundamental wave and the converted wave.

Also, since the phase matching condition of the wavelength conversion element is critical phase matching or quasi phase matching, the laser light source device having a profile-symmetric beam without a shift between a propagation direction of the fundamental wave and that of the converted wave can be achieved even when the crystal length of the wavelength conversion element is increased. As a result, the following advantage can be attained.

7. The high-efficient laser light source device is achieved by the wavelength conversion element having a long crystal length. Since the fundamental wave and the converted wave whose propagation directions are not shifted from each other are used, the fundamental wave and the converted wave can be coaxially used without an optical system for correcting a shift between the propagation directions. Further, with the beams of high profile symmetric property, the laser light source device which outputs the fundamental wave and the converted wave with high uniformity can be achieved.

Further, by properly selecting the laser medium, the wavelength conversion element, and the conversion process, the wavelengths of the fundamental wave and the converted wave can be selected. As a result, the following advantage can be attained.

8. The laser light source device for wavelength conversion to obtain the converted wave with a wavelength in a range of from 250 to 550 nm can be provided.

Also, the laser light source device can use continuous wave oscillation. As a result, the following advantage can be attained.

9. The laser light source device without variation in output can be achieved.

Further, by providing a Q switch element in the resonance optical path, pulse oscillation can be performed. As a result, the following advantage can be attained.

10. The laser light source device outputting lights with a plurality of wavelengths and providing a stable operation can be achieved without maintenance as compared with an excimer laser having a high peak power.

Also, the wavelength conversion element which generates the sum frequency by the fundamental wave and the converted wave obtained by irradiating the wavelength conversion element with the fundamental wave, can be provided in the resonance optical path. As a result, the following advantage can be attained.

11. The laser light source device which outputs the wavelength-converted wave with a shorter wavelength, such as a third harmonic wave, can be achieved. Further, the laser light source device which outputs the fundamental wave and the converted wave in addition to the short-wavelength light can be achieved.

Since the laser light source device has the above-described feature, when the device is applied to the laser irradiation apparatus, the following advantage can be attained.

1. Since the stable transverse-multimode light with the low coherency is used, the stable, high-efficient laser light source device providing the light without noise due to coherence and having the uniform profile can be achieved. Accordingly, for example, when the laser light source device is applied to laser annealing for manufacturing a Si thin-film transistor, or other semiconductor thin-film element such as a solar cell or a LSI, the irradiation beam intensity does not vary and becomes stable. As a result, the uniformity of size of polycrystal Si can be improved, variation in mobility can be decreased by decreasing the grain boundary, and leak current can be decreased. Also, with the transverse-multimode wavelength conversion, the decrease in variation can reflect to the laser irradiation apparatus using the short-wavelength light. A subject substance greatly absorbs the short-wavelength light. Thus, the variation can be decreased while the mobility is increased. That is, the characteristic can be improved and the yield can be increased.

In particular, the laser lights with two or three wavelengths of the fundamental wave and the converted wave can be simultaneously emitted. The laser irradiation apparatus for stable, high-efficient laser annealing can be provided, which utilizes great absorption for the short-wavelength light, and which has no noise due to the coherence or phase relationship. The configuration may be applied to a light source for a manufacturing apparatus of a Si solar cell, a light source for a manufacturing apparatus of a LSI semiconductor thin film, a light source for a surface modification process, an exposure light source, a processing light source, or the like. By using the laser irradiation apparatus for surface processing of various materials, the characteristic can be improved.

2. Since the laser light source device is highly efficient, the laser light source device can be used as a laser processing light source device, such as a laser annealing apparatus. Hence, the tact time of the annealing process can be decreased, and the throughput can be increased.

3. The laser light source device can serve as a compact light source for the laser annealing apparatus, and may be provided above a Si transistor substrate (annealing subject). Alternatively a plurality of the laser light source devices may be arranged in parallel to each other for a large-area Si transistor substrate. Also, laser annealing can be performed by moving the laser light source device, thereby facilitating annealing of the large-area Si transistor. Further, by using the plurality of light sources for the large-area Si transistor, the tact time can be decreased, while the throughput is increased and the characteristic is improved.

4. When the laser light source device is used as the light source for the laser annealing apparatus, an illumination optical system for correcting the optical axes of the fundamental wave and the converted wave is not necessary. The apparatus can be reduced in size, the cost can be decreased, and the degree of freedom for the design of the optical system, such as for the optical path length, can be increased.

5. A conversion wavelength which is greatly absorbed by a subject material (for example, Si) is selected from the fundamental wave or the converted wave of the second harmonic wave or the third harmonic wave, or is extracted from the converted waves by a proper rate, and is used for a light source for the laser annealing apparatus. Thus, annealing can be efficiently performed. With the compact laser annealing apparatus with high efficiency and low coherency, the characteristic of the annealing process can be increased, the tact time can be decreased, and the throughput can be increased.

6. Using a long-wavelength fundamental wave for which a subject material (for example, Si) has a relatively small absorption coefficient, the fundamental wave heats a deep position of a substrate. Also, using a short-wavelength converted wave for which the material has a large absorption coefficient, the material such as amorphous silicon can efficiently absorb the wavelength. Accordingly, the material can be changed or modified into polysilicon (polycrystal or microcrystal silicon). That is, by gently heating a periphery of a position, at which the material is desired to be changed, with the fundamental wave, thereby the heat generated by absorbing the converted wave can be prevented from being dissipated from the material. As a result, the effective, high-efficient laser irradiation apparatus can be achieved.

7. The laser light source device of the laser irradiation apparatus for the laser annealing apparatus or the like is configured such that the light source is moved relative to a substrate for annealing in the direction perpendicular to the longitudinal direction of the line beam, that is, in the short-axis direction. Accordingly, the following advantage can be attained. While a peripheral portion (front and rear portions in the short-axis direction) of a material is irradiated with the long-wavelength fundamental wave for which a material has a relatively small absorption coefficient, the material is modified or processed with the short-wavelength converted wave for which the material has a large absorption coefficient. In this case, in the long-axis direction of the beams, the fundamental wave and the converted wave provide uniform irradiation with substantially uniform beam diameters by an integrator or the like in the long-axis direction of the beams. In the short-axis direction of the beams, since the converted wave has the smaller beam diameter the fundamental wave provides preheating and slow cooling. Hence, by preheating the position of the material to be changed with the fundamental wave, the temperature at the position can be increased to a high temperature in a short time by irradiation with the converted wave. Also, the periphery of the changed position of the material can be continuously heated with the fundamental wave for which the material has the small absorption coefficient even after the material is changed. The periphery of the changed position can be slowly cooled, thereby preventing mechanical strain from occurring. In a crystallization process, a large crystal can be fabricated. That is, the position of the material to be changed can be heated to a high temperature in a short time after the position is sufficiently preheated at a relatively low temperature.

The present application contains subject matter related to that disclosed in Japanese Priority Patent Application JP 2008-172667 filed in the Japan Patent Office on Jul. 1, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser light source device comprising:
   a pump light source which emits transverse-multimode light;
   a plurality of resonator mirrors which define a resonator, at least part of the resonator mirrors outputting light, the output light having plural wavelengths;
   a laser medium arranged in the resonator, the laser medium being pumped with the transverse-multimode light emitted from the pump light source; and
   a wavelength conversion element arranged in the resonator, the wavelength conversion element being irradiated with a transverse-multimode line beam of fundamental wave obtained by oscillation at the laser medium and outputting a line beam of converted wave and further wherein the fundamental wave and the converted wave are simultaneously output and light having wavelengths different from the fundamental wave and the converted wave and/or second harmonic or third harmonic such that spatial intensity modulation is substantially eliminated, and further wherein output light is transverse-multimode light with low coherency and wherein one of the resonator mirrors has a reduced reflectance so that a transmittance is in a range of from 0.5% to 1% for the fundamental wave which is output for annealing.

2. The laser light source device according to claim 1, further comprising:

a reflecting portion for bending provided in the resonator, wherein one of the resonator mirrors or the reflecting portion transmits part of the fundamental wave.

3. The laser light source device according to claim 1, wherein the fundamental wave and the converted wave are output in the same direction.

4. The laser light source device according to claim 1, further comprising:

an external reflecting portion provided outside the resonator, wherein two converted waves are emitted from the wavelength conversion element to both sides along a resonance optical path, wherein one of the two emitted converted waves is extracted to the outside of the resonator, and is returned to the wavelength conversion element by the external reflecting portion, and wherein the one converted wave returned by the external reflecting portion is output to the outside together with the other converted wave generated by the wavelength conversion element and the fundamental wave.

5. The laser light source device according to claim 1, wherein the wavelength conversion element uses quasi phase matching.

6. The laser light source device according to claim 1, wherein the laser light source device uses continuous wave oscillation.

7. The laser light source device according to claim 1, further comprising:

a pulse generating mechanism which oscillates output light by pulse oscillation.

8. The laser light source device according to claim 7, wherein, as the pulse generating mechanism, a Q switch element exhibiting a Q switch effect, or a saturable absorber is provided in the resonator.

9. The laser light source device according to claim 1, further comprising:

a wavelength conversion element in the resonator defined by resonance optical path of the resonator mirrors, the wavelength conversion element outputting a wavelength-converted wave by irradiating the wavelength conversion element with the line beam of fundamental wave and the line beam of converted wave.

10. The laser light source device according to claim 9, wherein the wavelength conversion element irradiated with the line beam of fundamental wave and the line beam of converted wave outputs a wavelength-converted wave of sum frequency generation.

* * * * *